(12) United States Patent
Maegawa et al.

(10) Patent No.: US 11,538,796 B2
(45) Date of Patent: Dec. 27, 2022

(54) DISPLAY DEVICE

(71) Applicant: Sharp Fukuyama Laser Co., Ltd., Fukuyama (JP)

(72) Inventors: Masumi Maegawa, Hiroshima (JP); Katsuji Iguchi, Hiroshima (JP); Koji Takahashi, Hiroshima (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 153 days.

(21) Appl. No.: 17/109,840

(22) Filed: Dec. 2, 2020

(65) Prior Publication Data

US 2021/0183827 A1    Jun. 17, 2021

(30) Foreign Application Priority Data

Dec. 17, 2019  (JP) .............................. JP2019-227520

(51) Int. Cl.
*H01L 25/075* (2006.01)
*H01L 33/60* (2010.01)
*H01L 33/50* (2010.01)

(52) U.S. Cl.
CPC .......... *H01L 25/0753* (2013.01); *H01L 33/60* (2013.01); *H01L 33/50* (2013.01); *H01L 2933/0091* (2013.01)

(58) Field of Classification Search
CPC ..... H01L 33/46; H01L 25/0753; H01L 33/60; H01L 33/50; H01L 2933/0091
See application file for complete search history.

(56) References Cited

U.S. PATENT DOCUMENTS

| | | | |
|---|---|---|---|
| 2012/0087107 A1 | 4/2012 | Kunimasa et al. | |
| 2019/0235311 A1 | 8/2019 | Lee et al. | |
| 2019/0267357 A1* | 8/2019 | Iguchi | H01L 25/0753 |
| 2019/0273179 A1 | 9/2019 | Iguchi et al. | |
| 2020/0287103 A1* | 9/2020 | Maegawa | H01L 33/507 |

FOREIGN PATENT DOCUMENTS

| | | |
|---|---|---|
| CN | 110109283 A | 8/2019 |
| CN | 110224000 A | 9/2019 |
| JP | 2013-213932 A | 10/2013 |
| JP | 2014-089281 A | 5/2014 |
| TW | I643327 B | 12/2018 |
| WO | 2010/143461 A1 | 12/2010 |

* cited by examiner

*Primary Examiner* — Feifei Yeung Lopez
(74) *Attorney, Agent, or Firm* — ScienBiziP, P.C.

(57) ABSTRACT

In an image display device, a scattering unit has a size that covers a surface of a red conversion unit on a side that emits light having a second wavelength and a surface of a green conversion unit on a side that emits light having a third wavelength, and faces at most a part of a micro LED element.

9 Claims, 14 Drawing Sheets

DISPLAY DEVICE

BACKGROUND

1. Field

The present disclosure relates to a display device.

2. Description of the Related Art

A micro LED element is expected as a display element for an augmented reality (AR) glasses type terminal and a head-up display (HUD), for example. An image display element including a plurality of such micro LED elements, for example, has a structure in which a bandpass filter that transmits blue light as light from a light source and a wavelength conversion layer are arranged on a surface on a side that emits the light from the light source in the light source. The wavelength conversion layer may have a structure in which a phosphor that converts the wavelength of the blue light and a color filter are laminated. Further, on the light emitting surface of the wavelength conversion layer, in the related art, in order to suppress leakage of light from the liquid crystal display element or the light source, a bandpass filter that reflects the light from the light source and transmits the light after wavelength conversion is disposed.

As an image display device including the above-described image display element of the related art, for example, International Publication No. 2010/143461 discloses a display device in which two adjacent sets of a phosphor and a color filter are interposed by a black matrix. This black matrix functions as a light shielding material that shields the two sets from light entering between the two sets. Further, in the display device of International Publication No. 2010/143461, a counter substrate is provided on the surface of the color filter on the side that emits light. For this display panel, a direct-viewing type relatively large display element is used.

Further, for example, Japanese Unexamined Patent Application Publication No. 2013-213932 discloses a display device in which a laminate of a substrate main body and an external light filter is provided on a surface of a red coloring layer, a green coloring layer, and a blue coloring layer on a side that emits light. Japanese Unexamined Patent Application Publication No. 2014-89281 discloses a display device in which a third substrate is provided on a surface of a red conversion layer, a green conversion layer, and a blue conversion layer on a side that emits light. Both the laminate of Japanese Unexamined Patent Application Publication No. 2013-213932 and the third substrate of Japanese Unexamined Patent Application Publication No. 2014-89281 reflect the light from the light source in order to suppress leakage of the light from the light source and transmit the light emitted from the coloring layer (conversion layer).

However, in the display device disclosed in International Publication No. 2010/143461 described above, the counter substrate is provided on the entire surface of the color filter on the side that emits light. In addition, in the display devices disclosed in Japanese Unexamined Patent Application Publication No. 2013-213932 and Japanese Unexamined Patent Application Publication No. 2014-89281 described above, the laminate (third substrate) is provided on the entire surface on the side that emits light on the colored layer (conversion layer). Therefore, for example, when the display devices disclosed in International Publication No. 2010/143461, Japanese Unexamined Patent Application Publication No. 2013-213932, and Japanese Unexamined Patent Application Publication No. 2014-89281 are reduced in size and the pixel size is reduced, there is a concern that crosstalk occurs in which the counter substrate and the laminate (third substrate) themselves serve as light guide paths. Further, since the counter substrate and the like of International Publication No. 2010/143461 reflects the blue light which is the light from the light source, there is a problem that the blue light is not extracted when the counter substrate and the like are provided as described above.

One aspect of the disclosure is made in view of the above-described problems in order to achieve at least one of reduction of crosstalk and efficient extraction of blue light which is light from the light source.

SUMMARY

According to an aspect of the disclosure, there is provided a display device including a plurality of pixels formed of three or more sub pixels, in which, as the three or more sub pixels, each of the pixels includes a first sub pixel including a first light source that emits light having a first wavelength, a second sub pixel including a second light source that emits light having the first wavelength and a first wavelength conversion unit that converts the light having the first wavelength emitted from the second light source into light having a second wavelength, the second sub pixel being arranged adjacent to the first sub pixel, and a third sub pixel including a third light source that emits light having the first wavelength and a second wavelength conversion unit that converts the light having the first wavelength emitted from the third light source into light having a third wavelength, the third sub pixel being arranged adjacent to the second sub pixel, in which the display device further includes a first layer that reflects the light having the first wavelength and transmits the light having the second wavelength and the light having the third wavelength, and in which the first layer has a size that covers a surface of the first wavelength conversion unit on a side that emits the light having the second wavelength and a surface of the second wavelength conversion unit on a side that emits the light having the third wavelength, and faces at most a part of the first light source.

According to another aspect of the disclosure, there is provided a display device including a plurality of pixels formed of three or more sub pixels, in which, as the three or more sub pixels, each of the pixels includes a first sub pixel including a light source that emits light having a first wavelength, a second sub pixel including the light source and a first wavelength conversion unit that converts the light having the first wavelength emitted from the light source into light having a second wavelength, the second sub pixel being arranged adjacent to the first sub pixel, and a third sub pixel including the light source and a second wavelength conversion unit that converts the light having the first wavelength emitted from the light source into light having a third wavelength, the third sub pixel being arranged adjacent to the second sub pixel, in which the display device further includes a first layer that reflects the light having the first wavelength and transmits the light having the second wavelength and the light having the third wavelength, and in which the first layer has a size that covers a surface of the first wavelength conversion unit on a side that emits the light having the second wavelength and a surface of the second wavelength conversion unit on a side that emits the light having the third wavelength, and faces at most a part of the light source of the first sub pixel.

DESCRIPTION OF THE EMBODIMENTS

Overall Configuration of Image Display Device

Figure 1:
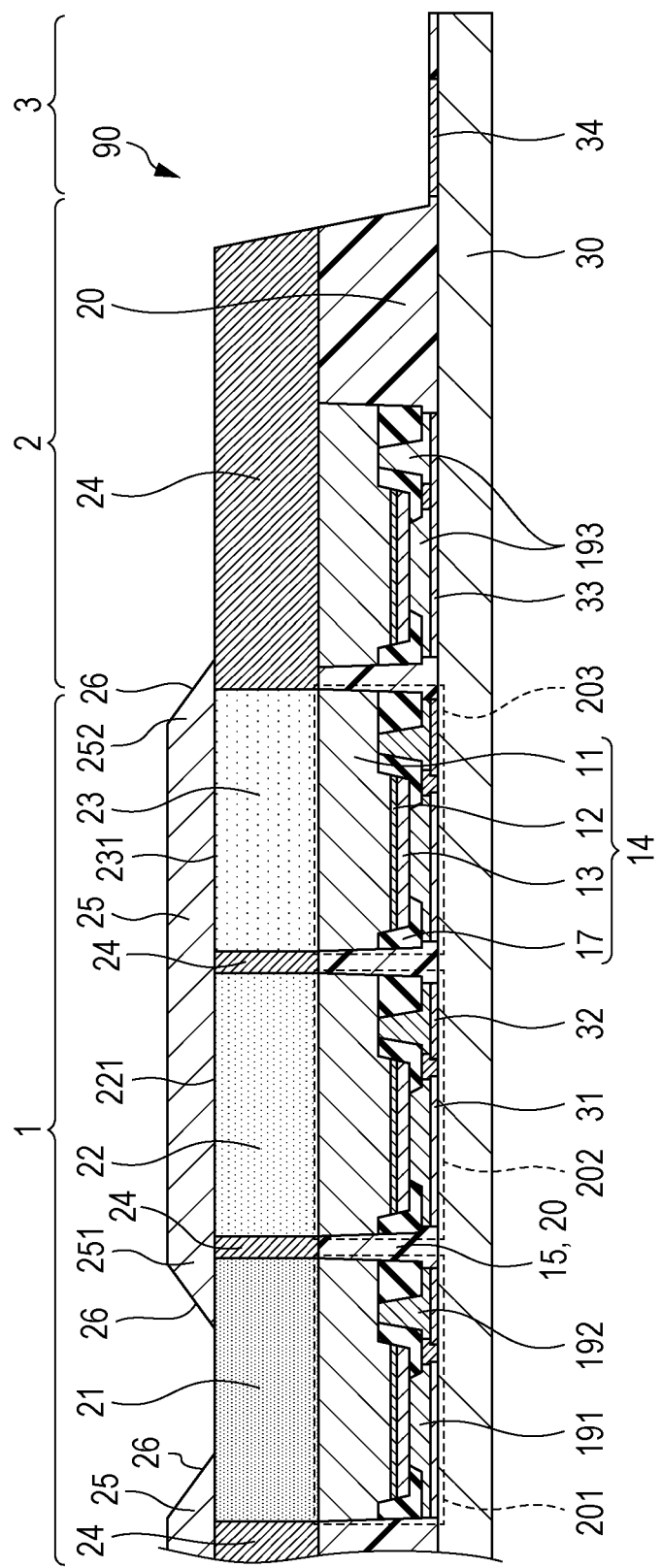
FIG. 1 is a sectional view schematically illustrating a structure of an image display device according to an embodiment of the disclosure.

An overall configuration of an image display device 90 according to an embodiment of the disclosure will be described with reference to FIGS. 1 and 2. The image display device 90 according to the embodiment is an example of a display device according to the disclosure, and includes a plurality of pixels 4 each including a blue sub pixel 5, a red sub pixel 6, and a green sub pixel 7. The sub pixels that form the pixel 4 of the image display device 90 are not limited to the blue sub pixel 5, the red sub pixel 6, and the green sub pixel 7. The pixel 4 of the image display device 90 may be formed of three or more sub pixels. As illustrated in FIG. 1, the image display device 90 includes a pixel area 1, a dummy area 2, and an outer peripheral portion 3.

Pixel Area

The pixel area 1 has a configuration in which the plurality of rectangular pixels 4 (refer to FIG. 2) are placed on a part of a drive circuit substrate 30. A pixel drive circuit (not illustrated) of each pixel 4 is mounted on a part corresponding to the pixel area 1 on the drive circuit substrate 30. In a case where the pixel area 1 is viewed in plan view, the plurality of pixels 4 are arranged in an array in the pixel area 1 as illustrated in FIG. 2. In FIG. 2, only 2×3 pixels 4 are disposed in an array for simplification of description, but in reality, m×n (m, n: natural number of 2 or more) pixels 4 are arranged in an array.

Blue Sub Pixel, Red Sub Pixel, and Green Sub Pixel

Figure 2:
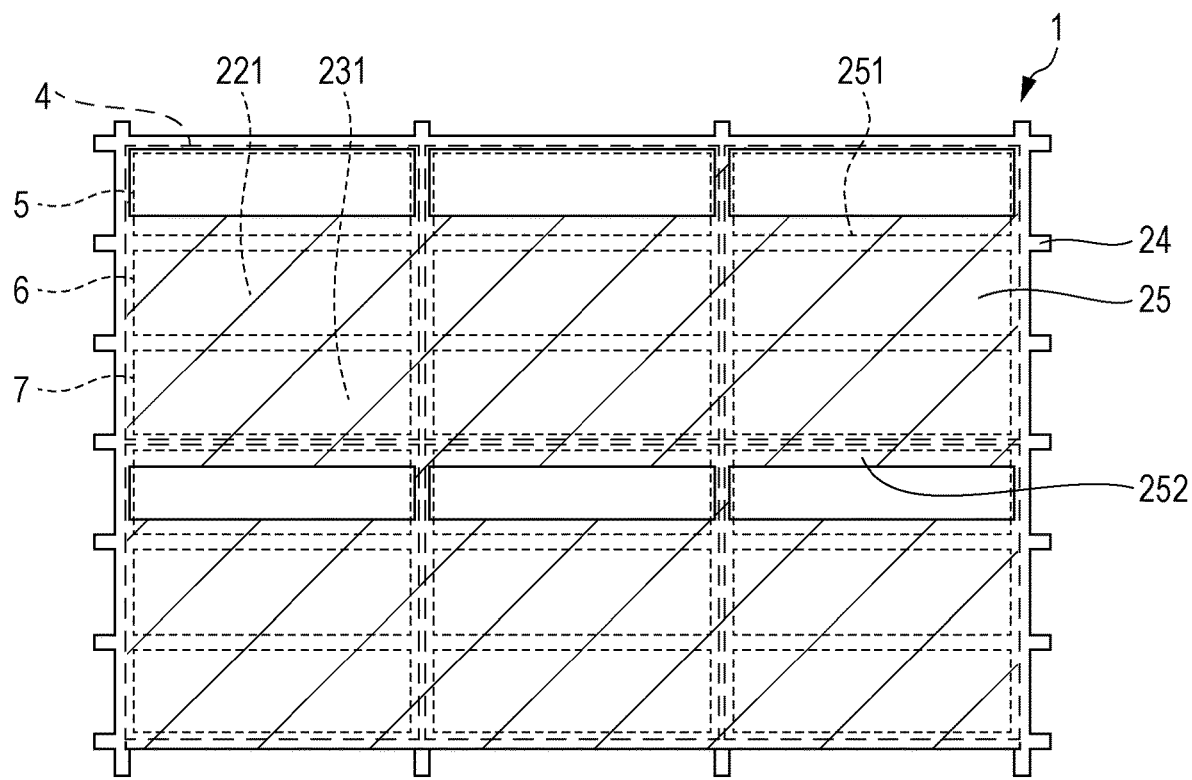
FIG. 2 is a plan view schematically illustrating a pixel area according to the embodiment of the disclosure.

As illustrated in FIG. 2, the pixel 4 includes the blue sub pixel 5, the red sub pixel 6, and the green sub pixel 7. Each of the shapes of the blue sub pixel 5, the red sub pixel 6, and the green sub pixel 7 also has a typical rectangular shape similar to the shape of the pixel 4.

Figure 3:
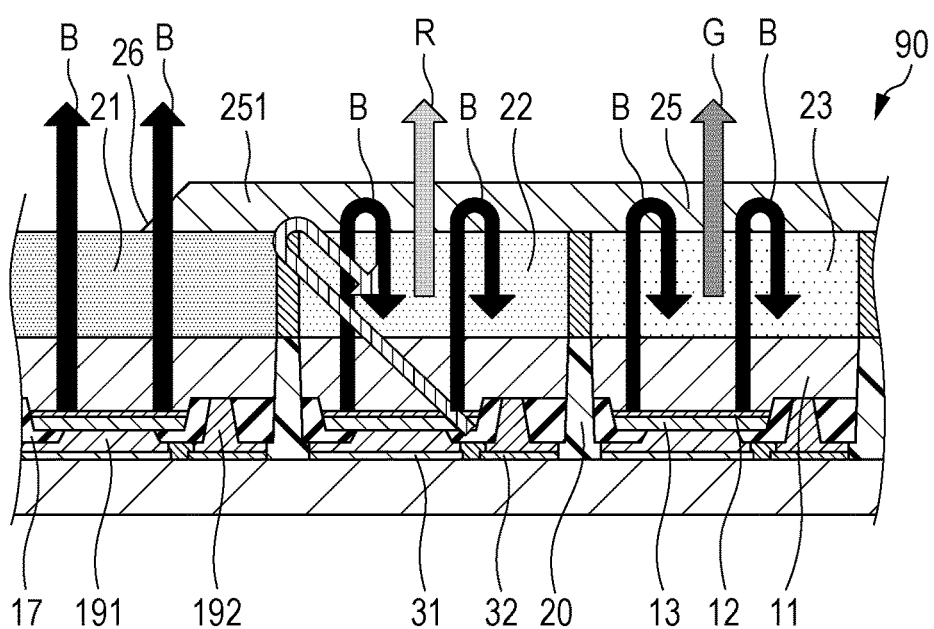
FIG. 3 is a sectional view schematically illustrating an optical path of light emitted from each sub pixel of the image display device.

The blue sub pixel 5 is an example of a first sub pixel according to the disclosure, and emits blue light B (refer to FIG. 3). The blue light B is an example of light having a first wavelength according to the disclosure, and the first wavelength is 380 to 490 nm. The red sub pixel 6 is an example of a second sub pixel according to the disclosure, and emits red light R (refer to FIG. 3). The red light R is an example of light having a second wavelength according to the disclosure, and the second wavelength is 570 to 830 nm. The green sub pixel 7 is an example of a third sub pixel according to the disclosure, and emits green light G (refer to FIG. 3). The green light G is an example of light having a third wavelength according to the disclosure, and the third wavelength is 490 to 570 nm. By adjusting at least one of the intensity and the peak wavelength of each light emitted from each of the blue sub pixel 5, the red sub pixel 6, and the green sub pixel 7, it is possible to emit light of various colors from the pixel 4.

The red sub pixel 6 is arranged adjacent to the blue sub pixel 5. The green sub pixel 7 is arranged adjacent to the red sub pixel 6. When the entire pixel area 1 is viewed in plan view, a group of blue sub pixels 5 in which the plurality of blue sub pixels 5 are arranged side by side in series is formed. Further, a group of red sub pixels 6 in which the plurality of red sub pixels 6 are arranged side by side in series is formed along the group of blue sub pixels 5. Furthermore, a group of green sub pixels 7 in which the plurality of green sub pixels 7 are arranged side by side in series is formed along the group of red sub pixels 6.

The light emitted from each of the sub pixels 5 to 7 is not limited to the blue light B, the red light R, and the green light G. Further, the shape of the pixel 4, the blue sub pixel 5, the red sub pixel 6, and the green sub pixel 7 in plan view is not limited to the rectangular shape illustrated in FIG. 2. As the shape of the pixels 4 and the like in plan view, for example, a hexagon and a circle can be considered. Furthermore, the arrangement of each of the blue sub pixel 5, the red sub pixel 6, and the green sub pixel 7 is not limited to the above-described arrangement.

As illustrated in FIG. 1, the blue sub pixel 5 has a micro LED element 201 that emits the blue light B. Specifically, the micro LED element 201 is placed on a part of the drive circuit substrate 30 that forms the blue sub pixel 5. The micro LED element 201 is an example of a first light source according to the disclosure. The red sub pixel 6 has a micro LED element 202 that emits the blue light B. Specifically, the micro LED element 202 is placed on a part of the drive circuit substrate 30 that forms the red sub pixel 6. The micro LED element 202 is an example of a second light source according to the disclosure. The green sub pixel 7 has a micro LED element 203 that emits the blue light B. Specifically, the micro LED element 203 is placed on a part of the drive circuit substrate 30 that forms the green sub pixel 7. The micro LED element 203 is an example of a third light source according to the disclosure.

The micro LED elements 201 to 203 have a nitride semiconductor layer 14, a P electrode 191, and an N electrode 192. The P electrode 191 and the N electrode 192 are arranged inside the micro LED elements 201 to 203 on the surface of the nitride semiconductor layer 14, which surface faces the drive circuit substrate 30.

The P electrode 191 is connected to a P side electrode 31 disposed on the surface of the drive circuit substrate 30 on the side facing the micro LED elements 201 to 203. The N electrode 192 is connected to an N side electrode 32 disposed on the surface of the drive circuit substrate 30 on the side facing the micro LED elements 201 to 203. The micro LED elements 201 to 203 emit the blue light B when a current flows from the P side electrode 31 corresponding to each of the micro LED elements 201 to 203. The direction in which the micro LED elements 201 to 203 emit the blue light B is the direction opposite to the side on which the drive circuit substrate 30 is disposed with reference to the arrangement position of the micro LED elements 201 to 203 (refer to FIG. 3).

In the nitride semiconductor layer 14, an N side layer 11, a light emitting layer 12, and a P side layer 13 are arranged being laminated in order from the surface on the side that emits the blue light B toward the side on which the drive circuit substrate 30 is disposed in the micro LED elements 201 to 203. Further, the surface of the N side layer 11 and the P side layer 13 on the drive circuit substrate 30 side and the side surface of the light emitting layer 12 are covered with a protection film 17.

Since there is a necessity of conducting electricity in the thickness direction of the nitride semiconductor layer 14, it is preferable that the N side layer 11 does not include a high resistance layer inside. It is preferable that the N side layer 11 is an N type good conductor throughout the entire nitride semiconductor layer 14 in the thickness direction. The light emitting layer 12 includes a multi-quantum well layer including an InGaN layer and a GaN layer. The N side layer 11 and the P side layer 13 each have various multilayer structures. The protection film 17 is an insulating material such as silicon dioxide.

In the embodiment, the specific configurations of the N side layer 11, the light emitting layer 12, and the P side layer 13 are not particularly limited, and for example, the configuration of the N side layer, the light emitting layer, and the P side layer to which the LED elements of the related art are adopted can be appropriately adopted. Therefore, in the embodiment, the description regarding the specific configurations of the N side layer 11, the light emitting layer 12, and the P side layer 13 is omitted.

The micro LED elements 201 to 203 are each divided by a pixel separation groove 15. The pixel separation groove 15 is filled with an embedding material 20. The embedding material 20 is a material of which the first purpose is to planarize the surface including the surface of each of the sub pixels 5 to 7 on the side that emits light. The embedding material 20 is formed of, for example, a resin material or a CVD film. Further, for example, in order to suppress leakage of light to adjacent sub pixels, the embedding material 20 may be formed of a resin containing a pigment or carbon black that absorbs light. Otherwise, in order to enhance the light output of each micro LED element by enhancing the reflection of light in the pixel separation groove 15, the embedding material 20 may be formed of a resin containing a white pigment or a scattering particle, which is a reflecting material.

By dividing the micro LED elements 201 to 203 by the pixel separation groove 15, it is possible to further reduce crosstalk between the sub pixels. This is because, when the nitride semiconductor layers 14 of two adjacent micro LED elements are connected to each other, a part of the blue light B generated in one micro LED element is emitted from the other micro LED element through the nitride semiconductor layer 14. This is because crosstalk occurs when a part of the blue light B is emitted from the sub pixel including the other micro LED element. Crosstalk is not preferable because crosstalk reduces the contrast and color purity of the image.

A scattering unit 21 is placed on the surface of the micro LED element 201 on the side that emits the blue light B. The scattering unit 21 is an example of a second layer according to the disclosure, and scatters the blue light B emitted from the micro LED element 201 toward the outside of the image display device 90. The scattering unit 21 is formed of a transparent resin pattern containing scattering particles. The scattering unit 21 emits the blue light B emitted from the micro LED element 201 to the outside of the image display device 90 while expanding in the emitting direction by the scattering particles without wavelength conversion of the blue light B. By placing the scattering unit 21 on the surface of the micro LED element 201 on the side that emits the blue light B, it is possible to reduce light unevenness.

The scattering unit 21 may not include the scattering particles, and may have only the function of transmitting the blue light. The scattering unit 21 may not be formed of a transparent resin pattern. In other words, the scattering unit 21 may be a member having optical transparency, which scatters or transmits the blue light B emitted from the micro LED element 201. Furthermore, the blue sub pixel 5 may not have the scattering unit 21.

A red conversion unit 22 is placed on the surface of the micro LED element 202 on the side that emits the blue light B. The red conversion unit 22 is an example of a first wavelength conversion unit according to the disclosure, and converts the wavelength of the blue light B emitted from the micro LED element 202 to generate the red light R, and emits the generated red light R toward the outside of the image display device 90. The red conversion unit 22 is formed of a resin pattern containing a material that can convert the wavelength of the blue light B to generate the red light R. The red conversion unit 22 may not be formed of the resin pattern.

A green conversion unit 23 is placed on the surface of the micro LED element 203 on the side that emits the blue light B. The green conversion unit 23 is an example of a second wavelength conversion unit according to the disclosure, and converts the wavelength of the blue light B emitted from the micro LED element 203 to generate the green light G, and emits the generated green light G toward the outside of the image display device 90. The green conversion unit 23 is formed of a resin pattern containing a material that can convert the wavelength of the blue light B to generate the green light G. The green conversion unit 23 may not be formed of the resin pattern.

As illustrated in FIGS. 1 and 2, light shielding members 24 are disposed between the scattering unit 21 and the red conversion unit 22, between the red conversion unit 22 and the green conversion unit 23, and between the green conversion unit 23 and the scattering unit 21. The light shielding member 24 is a member that absorbs or reflects light leaking from the micro LED element, the scattering unit 21, or the color conversion unit to reduce crosstalk.

The light shielding member 24 may be formed of a resin containing a pigment or carbon black that absorbs light. Further, for example, the light shielding member 24 may be formed of a resin containing a white pigment or a scattering particle which functions as a reflecting material in order to improve the light extraction efficiency of the sub pixels. For example, the light shielding member 24 may be formed by covering the entire surface of the light shielding member main body formed of resin with a metal film, or may be formed of a metal material. It is preferable that the metal film and the metal material are silver or aluminum having high reflectance.

Blue Reflection Layer

As illustrated in FIGS. 1 and 2, on a surface 221 of the red conversion unit 22 of the red sub pixel 6 on the side that emits the red light R and a surface 231 of the green conversion unit 23 of the green sub pixel 7 on the side that emits the green light G, a blue reflection layer 25 is disposed. Specifically, the surface 221 and the surface 231 are covered with the blue reflection layer 25. The blue reflection layer 25 is an example of the first layer according to the disclosure, reflects the blue light B, and transmits the red light R and the green light G. The blue reflection layer 25 is, for example, a dielectric multilayer film in which a titanium oxide thin film and a silicon dioxide thin film are laminated. Details of the laminated structure of the blue reflection layer 25 will be described later. The blue reflection layer 25 is not limited to the dielectric multilayer film. The blue reflection layer 25 may be any member as long as the member reflects the blue light B and transmits the red light R and the green light G.

Hereinafter, the behavior of the blue light B incident on the blue reflection layer 25 will be described. For simplification of description, only the behavior of the blue light B leaking from the red conversion unit 22 will be described. After the blue light B reflected by the blue reflection layer 25 is incident on the red conversion unit 22 again (refer to FIG. 3), a part of the blue light B is once absorbed by the red conversion unit 22. The remaining blue light B, which is not absorbed by the red conversion unit 22 and is incident on the micro LED element 202, is finally incident on an area between the P side layer 13 and the P electrode 191, and is confined in the area.

In this manner, the blue light B leaking from the red conversion unit 22 is reflected by the blue reflection layer 25 and a part thereof is confined in the area between the P side layer 13 and the P electrode 191. Therefore, the phenomenon that the blue light B leaking from the red conversion unit 22 is emitted to the outside of the image display device 90 is greatly reduced. The wavelength of at least a part of the blue light B once absorbed by the red conversion unit 22 is converted, and the converted light is emitted from the surface 221 as the red light R.

The blue light B leaking again from the red conversion unit 22 without being converted into the red light R also takes the above-described series of behaviors. Therefore, every time the blue light B leaking from the red conversion unit 22 repeats the series of behaviors described above, the wavelength conversion of the blue light B into the red light R progresses, and the conversion efficiency of the blue light B increases. In this manner, by providing the blue reflection layer 25 in the image display device 90, it is possible to greatly reduce the emission of the blue light B leaking from the red conversion unit 22 to the outside of the image display device 90, and to improve the conversion efficiency of the blue light B of the red conversion unit 22. Therefore, the thickness of the red conversion unit 22 can be made thinner by the amount that the conversion efficiency of the blue light B increases. The above description also applies to the blue light B leaking from the green conversion unit 23.

As illustrated in FIGS. 1 and 2, among the four end portions of the blue reflection layer 25, a first end portion 251 that covers the end portion on the long side of the red conversion unit 22 also covers the end portion disposed closest to the red conversion unit 22 in the scattering unit 21 of the blue sub pixel 5. Among the four end portions, a second end portion 252 that covers the end portion on the long side of the green conversion unit 23 also covers the end portion disposed closest to the green conversion unit 23 in the scattering unit 21 of the blue sub pixel 5. In other words, the first end portion 251 faces the end portion disposed closest to the micro LED element 202 in the micro LED element 201. The second end portion 252 faces the end portion disposed closest to the micro LED element 203 in the micro LED element 201.

As illustrated in FIG. 1, an inclined side surface 26 of the first end portion 251 of the blue reflection layer 25 is inclined toward the red sub pixel 6 disposed closest to the inclined side surface 26. The entire inclined side surface 26 of the first end portion 251 covers the end portion disposed closest to the red conversion unit 22 in the scattering unit 21 of the blue sub pixel 5. The inclined side surface 26 of the second end portion 252 of the blue reflection layer 25 is inclined toward the green sub pixel 7 disposed closest to the inclined side surface 26. The entire inclined side surface 26 of the second end portion 252 covers the end portion disposed closest to the green conversion unit 23 in the scattering unit 21 of the blue sub pixel 5. The inclined side surface 26 is an example of the close side surface and the inclined side surface according to the disclosure. The first end portion 251 and the second end portion 252 are examples of the end portion including the inclined side surface according to the disclosure.

The arrangement of these inclined side surfaces 26 is merely an example. For example, a part of the inclined side surface 26 of the first end portion 251 may cover the end portion disposed closest to the red conversion unit 22 in the scattering unit 21 of the blue sub pixel 5. In this case, on the inclined side surface 26 of the first end portion 251, the surface other than the part covers the light shielding member 24 disposed between the scattering unit 21 covered with a part of the inclined side surface 26 and the red conversion unit 22. Otherwise, the other surface may cover up to the end portion on the long side of the red conversion unit 22.

For example, a part of the inclined side surface 26 of the second end portion 252 may cover the end portion disposed closest to the green conversion unit 23 in the scattering unit 21 of the blue sub pixel 5. In this case, on the inclined side surface 26 of the second end portion 252, the surface other than the part covers the light shielding member 24 disposed between the scattering unit 21 covered with a part of the inclined side surface 26 and the green conversion unit 23. Otherwise, the other surface may cover up to the end portion on the long side of the green conversion unit 23.

The surface shape of the inclined side surface 26 is a planar shape in the embodiment. The surface shape of the inclined side surface 26 is not particularly limited, but a flat surface shape and an arc shape which protrudes to the outside of the image display device 90 are preferable (refer to FIGS. 6 and 7). This is because these shapes are easier to process the inclined side surface 26 than other shapes, and it is easy to ensure that the surface of the red and green conversion units 22 and 23 on the side that emits the red light R and the green light G has a high flatness. As a result of this effect, the amount of the blue light B leaking from the inclined side surface 26 to the adjacent sub pixel can be reduced. The influence of the inclined side surface 26 on the blue light B incident on the first and second end portions 251 and 252 will be described later.

Dummy Area and Outer Peripheral Portion

The dummy area 2 is an area formed adjacent to the pixel area 1 of the image display element 200, and is provided to ensure the flatness of the display surface of the image display device 90. As illustrated in FIG. 1, the nitride semiconductor layer 14 is placed on a part of the drive circuit substrate 30 that forms the dummy area 2. The nitride semiconductor layer 14 of the dummy area 2 and the nitride semiconductor layer 14 of the micro LED element 203 adjacent to the nitride semiconductor layer 14 of the dummy area 2 are divided by the pixel separation groove 15 filled with the embedding material 20. The outer side surface of the nitride semiconductor layer 14 in the dummy area 2 is covered with the embedding material 20. Further, in the dummy area 2, the nitride semiconductor layer 14, the pixel separation groove 15, and the embedding material 20 are covered with the light shielding member 24 in plan view. In other words, the light shielding member 24 of the dummy area 2 is arranged at the same position as the arrangement position of the scattering unit 21, the red conversion unit 22, and the green conversion unit 23 in side view.

For example, a row selection circuit, a column signal output circuit, an image processing circuit, an input/output circuit, and the like are arranged on a part of the drive circuit substrate 30 that forms the dummy area 2. The nitride semiconductor layer 14 in the dummy area 2 does not emit light. The P side electrode and the N side electrode included in the nitride semiconductor layer 14 in the dummy area 2 are dummy electrodes 33 through which no current flows. The dummy electrode 33 fixes the nitride semiconductor layer 14 to a part of the drive circuit substrate 30 that forms the dummy area 2, and shields various circuits such as the above-described row selection circuit from light. The P electrode and the N electrode included in the nitride semiconductor layer 14 in the dummy area 2 are also dummy electrodes 193 through which no current flows.

The outer peripheral portion 3 forms the outer edge of the image display device 90. In the outer peripheral portion 3, a cut area (not illustrated) for dividing the image display device 90 into individual pieces is formed. An external connection electrode 34 for electrically connecting the image display device 90 to an external circuit such as a wire bond pad is provided on a part of the drive circuit substrate 30 that forms the outer peripheral portion 3. Meanwhile, the nitride semiconductor layer 14 is not provided on the outer peripheral portion 3.

Advantages of Forming Inclined Side Surfaces on First End Portion and Second End Portion With reference to FIGS. 3 to 5 and 16, the advantages of forming the inclined side surface 26 at each of the first end portion 251 and the second end portion 252 of the blue reflection layer 25 will be described.

Problems of Image Display Device of Related Art and Image Display Device according to Comparative Example In an image display device (not illustrated) of the related art, the entire surface on the side that emits the blue light at a part corresponding to the scattering unit 21 of the image display device 90 is covered with a bandpass filter or the like. Therefore, the image display device of the related art has problems of crosstalk and deterioration of extraction efficiency of the blue light.

Therefore, a configuration of an image display device that can resolve the above-described problem will be considered with a comparative example. First, for example, as illustrated in a view indicated by a reference numeral 701 in FIG. 16, an image display device 96 in which the entire surface of the scattering unit 21 on the side that emits the blue light B is exposed to the outside is considered. In the image display device 96, a side surface 261 of the blue reflection layer 25 disposed close to the scattering unit 21 as a whole is disposed substantially perpendicular to the surface of the scattering unit 21 on the side that emits the blue light B. The entire surface of the scattering unit 21 on the side that emits the blue light B is exposed to the outside, and thus, the extraction efficiency of the blue light B is remarkably improved to be higher than that of the image display device of the related art.

However, in the image display device 96, a part of the blue light B (broken line arrow in the drawing) obliquely leaking from the red conversion unit 22 reaches the side surface 261 after becoming incident on the blue reflection layer 25 at a predetermined incident angle, and transmits through the side surface 261 without being reflected. The predetermined incident angle is 30 degrees or more with respect to the surface of the red conversion unit 22 on the side that emits the red light R. Therefore, crosstalk occurs between the blue light B transmitted through the side surface 261 and the blue light B transmitted through the scattering unit 21.

Figure 16:
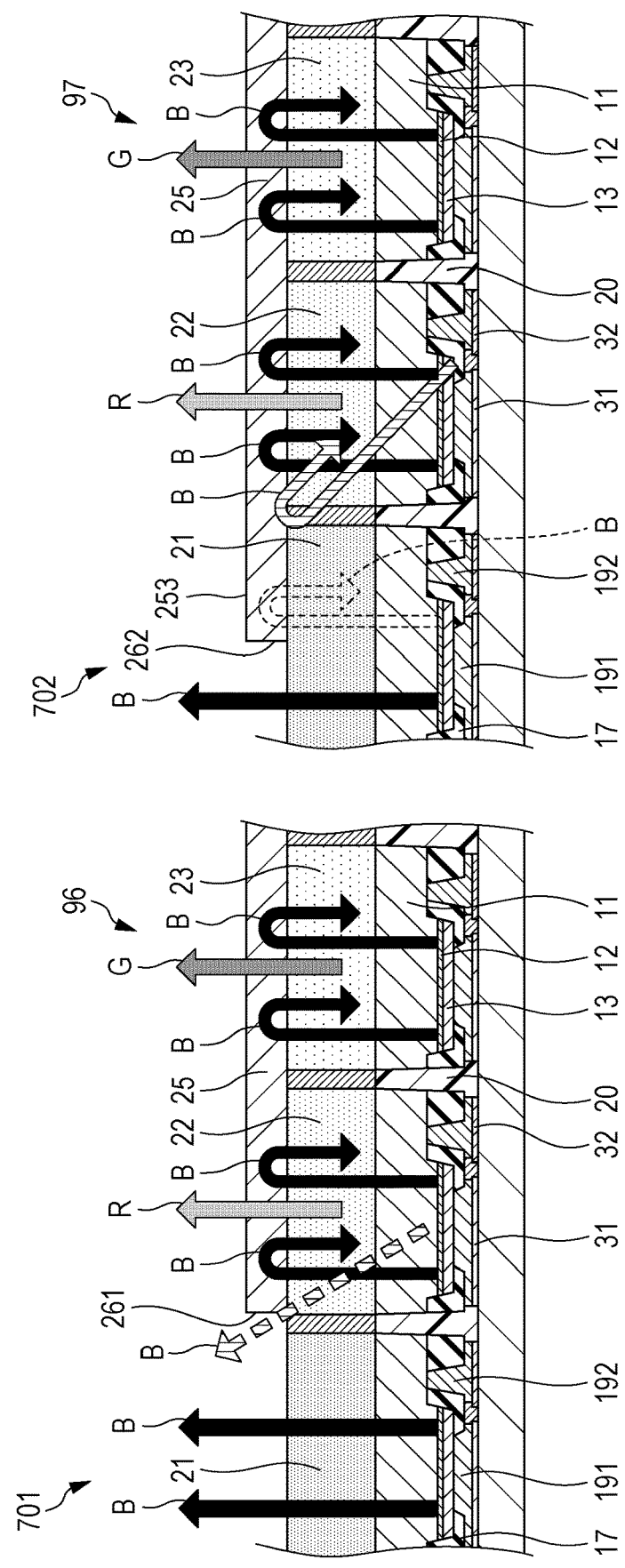

Next, for example, as illustrated in a view indicated by a reference numeral 702 in FIG. 16, an image display device 97 in which an end portion 253 of the blue reflection layer 25 covers a part of the scattering unit 21 is considered. In the image display device 97 as well, a side surface 262 of the blue reflection layer 25 disposed close to the scattering unit 21 as a whole is disposed substantially perpendicular to the surface of the scattering unit 21 on the side that emits the blue light B.

In the image display device 97, the end portion 253 projects toward the scattering unit 21 side further than the end portion including the side surface 261 of the image display device 96. Therefore, even when a part of the blue light B obliquely leaking from the red conversion unit 22 is incident on the blue reflection layer 25 at a predetermined incident angle, the part of the blue light B does not reach the side surface 262 and is reflected by the blue reflection layer 25. Therefore, it is possible to reduce the occurrence of crosstalk between the blue light B leaking from the red conversion unit 22 and the blue light B transmitted through the scattering unit 21.

However, in the image display device 97, since a part of the surface of the scattering unit 21 on the side that emits the blue light B is covered with the end portion 253, the blue light B emitted from a part of the surface is also reflected by the end portion 253 (broken line arrow in the drawing). Therefore, the extraction efficiency of the blue light B of the image display device 97 is higher than that of the image display device of the related art, but is lower than that of the image display device 96.

First Advantage

Meanwhile, the image display device 90 resolves the above-described two problems that the image display device of the related art has. First, in the image display device 90, as illustrated in FIG. 3, a part of the surface of the scattering unit 21 on the side that emits the blue light B is covered with the first end portion 251 and the second end portion 252. For simplification of description, in FIG. 3, a state where a part of the surface of the scattering unit 21 on the side that emits the blue light B is covered with the second end portion 252 is not illustrated. Therefore, similarly to the image display device 97, it is possible to reduce the occurrence of crosstalk.

Next, the image display device 90 can maintain the extraction efficiency of the blue light B in the blue sub pixel 5 to the same level as that in a case where the entire surface of the scattering unit 21 on the side that emits the blue light B is exposed to the outside. Hereinafter, the reason thereof will be described.

Figure 4:
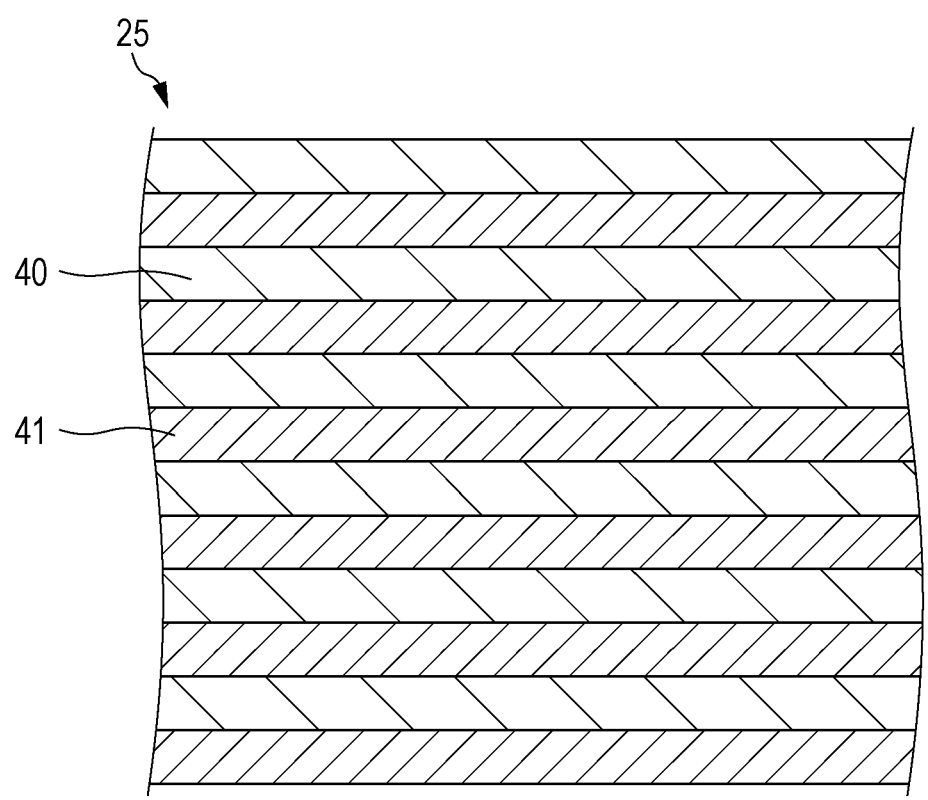
FIG. 4 is a sectional view schematically illustrating a structure of a blue reflection layer according to the embodiment of the disclosure.

As illustrated in FIG. 4, the blue reflection layer 25 is a dielectric multilayer film in which a titanium oxide thin film which is a first functional layer 40 and a silicon dioxide thin film which is a second functional layer 41 are laminated. The refractive index of the first functional layer 40 with respect to the blue light B is different from the refractive index of the second functional layer 41 with respect to the blue light B.

It is needless to say that the first functional layer 40 may be a silicon dioxide thin film and the second functional layer 41 may be a titanium oxide thin film. Further, both the first and second functional layers 40 and 41 may be films other than the titanium oxide thin film and the silicon dioxide thin film. In other words, at least a part of the blue reflection layer 25 may have a structure in which two or more types of functional layers that reflect the blue light B and transmit the red light R and the green light G are laminated. However, it is preferable that the two or more types of functional layers have different refractive indexes with respect to the blue light B.

Figure 5:
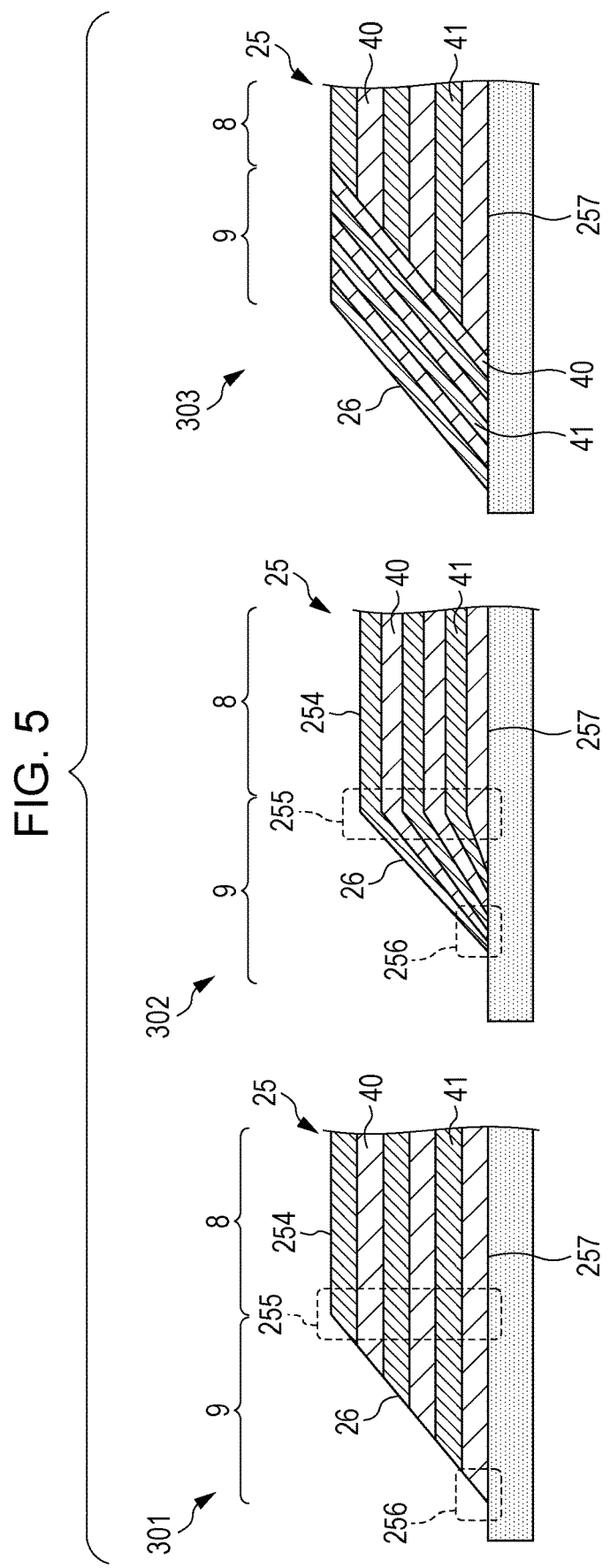
In FIG. 5, a view indicated by a reference numeral 301 is a sectional view schematically illustrating a structure of first and second parts of the blue reflection layer, and views indicated by reference numerals 302 and 303 are sectional views schematically illustrating variations of the structures of the first and second parts.

Specifically, as illustrated in a view indicated by a reference numeral 301 in FIG. 5, on a first part 8 that forms a part of the blue reflection layer 25, in the direction perpendicular to a flat surface 254 of the blue reflection layer 25, the first functional layer 40 and the second functional layer 41 are alternately laminated. The flat surface 254 is a surface of the blue reflection layer 25 opposite to a back surface 257 facing the red conversion unit 22 and the green conversion unit 23, and is substantially parallel to the surface of the red conversion unit 22 on the side that emits the red light R. The flat surface 254 is also substantially parallel to the surface of the green conversion unit 23 on the side that emits the green light G.

Except for the first part 8 of the blue reflection layer 25, the blue reflection layer 25 is formed of two second parts 9 including the inclined side surface 26. The one second part 9 forms a part of the first end portion 251 and the other second part 9 forms a part of the second end portion 252.

All the first and second functional layers 40 and 41 that form the second part 9 are the same type as the first and second functional layers 40 and 41 that form the first part 8. Further, all the first and second functional layers 40 and 41 that form the second part 9 are formed to be respectively connected to the first and second functional layers 40 and 41 that form the first part 8. Furthermore, even in the second part 9, the first functional layer 40 and the second functional layer 41 are alternately laminated in the direction perpendicular to the flat surface 254 of the blue reflection layer 25. Even in any of the first part 8 and the second part 9, the first functional layer 40 and the second functional layer 41 may not be alternately laminated.

In a case where the blue reflection layer 25 is formed of a multilayer film as described above, the wavelength selectivity of the blue reflection layer 25 becomes different in accordance with the material and thickness of the first and second functional layers 40 and 41 or the number of laminated layers of the first and second functional layers 40 and 41. Here, since the inclined side surfaces 26 are formed in the first and second end portions 251 and 252 of the blue reflection layer 25, in the second part 9, the thickness of each functional layer becomes thinner as going toward a tip end part 256 from a part 255 closest to the center of the blue reflection layer 25. For example, in the part 255 closest to the center of the blue reflection layer 25 in the second part 9, the end portion of the second functional layer 41 disposed closest to the flat surface 254 becomes thinner toward the tip end thereof. Meanwhile, at the tip end part of the second part 9, all of the tip end parts of the first and second functional layers 40 and 41 become thinner as going toward the tip end.

Furthermore, in the second part 9, the number of laminated layers of the first and second functional layers 40 and 41 decreases as going toward the tip end part 256 from the part 255 closest to the center of the blue reflection layer 25. For example, in the part 255 closest to the center of the blue reflection layer 25 in the second part 9, the number of laminated layers of the first and second functional layers 40 and 41 is the same as the number of laminated layers of the first and second functional layers 40 and 41 in the first part 8. Meanwhile, in the tip end part 256 of the second part 9, the number of laminated layers of the first functional layer 40 is one and the number of laminated layers of the second functional layer 41 is zero.

Due to such a laminated state of the first and second functional layers 40 and 41, in the second part 9, wavelength selectivity, particularly, reflectivity with respect to the blue light B deteriorates as going toward the tip end part 256 from the part 255 closest to the center of the blue reflection layer 25. Therefore, most of the blue light B perpendicularly incident on the second part 9 of the first and second end portions 251 and 252 transmits through the second part 9 without being reflected. Here, "perpendicularly" of "perpendicularly incident on the second part 9" specifically means a state of being perpendicular to the contact surface of the second part 9 (the surface facing a part of the micro LED element 201) with the scattering unit 21. As described above, it is possible to maintain the extraction efficiency of the blue light B in the blue sub pixel 5 to the same level as that in a case where the entire surface of the scattering unit 21 on the side that emits the blue light B is exposed to the outside.

As illustrated in a view indicated by a reference numeral 302 in FIG. 5, each of the first and second functional layers 40 and 41 that form the second part 9 may be inclined in the same direction as the inclination direction of the inclined side surface 26. In this case, the inclination angle of each functional layer is different from the inclination angle of the inclined side surface 26. Specifically, as the distance from the inclined side surface 26 increases, the inclination angle of the functional layer decreases. Here, the inclination angle indicates an angle made by a reference surface and the surface of each of the functional layers that form the second part 9 on the inclined side surface 26 side while each surface of each of the sub pixels 5 to 7 on the side that emits the light is the reference surface. It is needless to say that the inclination angle of each functional layer is not limited to the above-described inclination angle.

By inclining each of the functional layers in this manner, in the second part 9, the thickness of each functional layer uniformly becomes thinner as going toward the tip end part 256 from the part 255 closest to the center of the blue reflection layer 25. Further, the number of laminated layers of the first and second functional layers 40 and 41 decreases as going toward the tip end part 256 from the part 255 closest to the center of the blue reflection layer 25. For example, at the tip end part 256 of the second part 9, the number of laminated layers of the first and second functional layers 40 and 41 is one, respectively. Therefore, it is possible to maintain the extraction efficiency of the blue light B in the blue sub pixel 5 to the same level as that in a case where the entire surface of the scattering unit 21 on the side that emits the blue light B is exposed to the outside.

In addition, the laminated state of the first and second functional layers 40 and 41 is not limited to the example illustrated in views indicated by the reference numerals 301 and 302 in FIG. 5. For example, each of the first and second functional layers 40 and 41 that form the second part 9 may be inclined in the same direction as the inclination direction of the inclined side surface 26, and the inclination angle of each functional layer may be the same as the inclination angle of the inclined side surface 26. In this case, the thicknesses of the first and second functional layers 40 and 41 that form the second part 9 do not change, but the number of laminated layers of the first and second functional layers 40 and 41 decreases as going toward the tip end part 256 from the part 255 closest to the center of the blue reflection layer 25. In other words, the second part 9 may be configured such that at least the number of laminated layers of the first and second functional layers 40 and 41 decreases as going toward the tip end part 256 from the part 255 closest to the center of the blue reflection layer 25.

Second Advantage

Next, according to the image display device 90, high resolution can also be realized while easily processing the blue reflection layer 25. Hereinafter, the reason thereof will be described. In the image display device 90, the first and second end portions 251 and 252 of the blue reflection layer 25 face a part of the micro LED element 201 of the blue sub pixel 5. In other words, the first end portion 251 projects toward the scattering unit 21 side beyond the end portion on the long side of the red conversion unit 22 and covers a part of the scattering unit 21. Similarly, the second end portion 252 projects toward the scattering unit 21 side beyond the end portion on the long side of the green conversion unit 23 and covers a part of the scattering unit 21 (refer to FIGS. 1 to 3).

Therefore, when the inclined side surface 26 of the first end portion 251 is slightly inclined toward the red sub pixel 6, the end portion on the long side of the red conversion unit 22 is not covered with the inclined side surface 26 of the first end portion 251. Similarly, when the inclined side surface 26 of the second end portion 252 is slightly inclined toward the green sub pixel 7, the end portion on the long side of the green conversion unit 23 is not covered with the inclined side surface 26 of the second end portion 252. Therefore, even when the pitch between the blue sub pixel 5 and the red sub pixel 6 and the pitch between the blue sub pixel 5 and the green sub pixel 7 are shortened, the necessity of strictly adjusting the inclination angle of the inclined side surface 26 is reduced.

Therefore, even when the inclination angle of the inclined side surface 26 is roughly adjusted to some extent, an area of the flat surface 254 can be ensured to the extent that the flat surface 254 of the blue reflection layer 25 covers the entire surface of the red and green conversion units 22 and 23 on the side that emits the red light R and the green light G. This means that the flatness of the blue reflection layer 25 is improved with respect to the surface of the red conversion unit 22 on the side that emits the red light R and the surface of the green conversion unit 23 on the side that emits the green light G. From the above, the image display device 90 having high resolution can be realized by simple processing of the blue reflection layer 25.

Third Advantage

In the image display device 90, for example, as illustrated in a view indicated by a reference numeral 303 in FIG. 5, each of the first and second functional layers 40 and 41 that form the second part 9 may be inclined at the same angle as the inclination angle of the inclined side surface 26. In other words, each of the first and second functional layers 40 and 41 that form the second part 9 may be laminated in the direction perpendicular to the inclination direction of the inclined side surface 26. Specifically, the first functional layer 40 or the second functional layer 41 including the inclined side surface 26 is formed in the second part 9. Then, the first and second functional layers 40 and 41 are sequentially laminated on the functional layer including the inclined side surface 26 in the direction perpendicular to the inclination direction of the inclined side surface 26.

In the embodiment, the thickness of each functional layer in the second part 9 is smaller than the thickness of each functional layer in the first part 8. The relationship between the thickness of each functional layer in the second part 9 and the thickness of each functional layer in the first part 8 is not particularly limited. For example, the thickness of each functional layer in the second part 9 may be the same as the thickness of each functional layer in the first part 8, or the thickness of each functional layer in the second part 9 may be thicker than the thickness of each functional layer in the first part 8.

By setting the laminated state of each functional layer in the second part 9 as described above, the reflectivity of the blue light B in the first and second end portions 251 and 252 is further improved. Therefore, it is possible to further reduce transmission of the blue light B leaking in the oblique direction from the red and green conversion units 22 and 23 through the blue reflection layer 25, and to further reduce crosstalk between the blue light B emitted from the blue sub pixel 5 and the blue light B leaking from the red and green conversion units 22 and 23.

In the second part 9 in a view indicated by the reference numeral 303 in FIG. 5, the first functional layer 40 or the second functional layer 41 may not include the inclined side surface 26. In other words, the second part 9 may not be formed at the tip ends of the first and second end portions 251 and 252. The second part 9 may be formed in an area of any of the first and second end portions 251 and 252.

Supplementary Information

The above-described first to third advantages can be achieved not only when all of the first and second functional layers 40 and 41 that form the first part 8 are the same as the types of the first and second functional layers 40 and 41 that form the second part 9. Even when all or a part of the types of the first and second functional layers 40 and 41 that form the first part 8 are different from the types of the first and second functional layers 40 and 41 that form the second part 9, it is possible to achieve the above-described first to third advantages. Specifically, by appropriately adjusting the material, thickness and the like of at least one of the first and second functional layers 40 and 41 that form the first part 8 and the first and second functional layers 40 and 41 that form the second part 9, it is possible to achieve the above-described first to third advantages.

Figure 6:
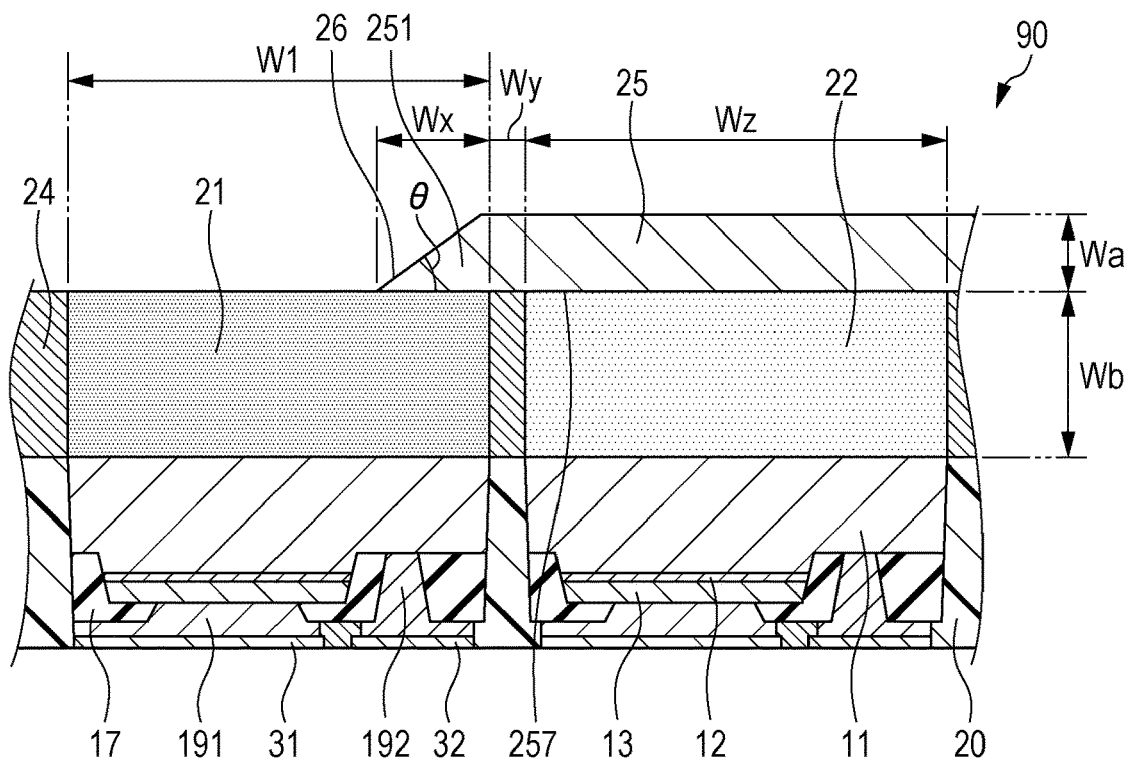
FIG. 6 is a sectional view schematically illustrating the structure of the image display device in a case where an inclined side surface of the second part has a planar shape.

Method of Determining Each Dimension or the Like of Blue Reflection Layer, Each Sub Pixel, and Light Shielding Member A method for determining each dimension or the like of the blue reflection layer 25, each of the sub pixels 5 to 7, and the light shielding member 24 will be described with reference to FIGS. 6 and 7. As illustrated in FIG. 6, in a case where the inclined side surface 26 is processed into, for example, a planar shape, it is preferable to determine each dimension or the like of the blue reflection layer 25, each of the sub pixels 5 to 7, and the light shielding member 24 as follows. When the dimensions or the like are determined as follows, without reducing the intensity of the blue light B emitted from the blue sub pixel 5, it is possible to both the improvement of the intensity of the red light R and the green light G in the red and green sub pixels 6 and 7 and the reduction of the leakage amount of the blue light B at the same time.

Specifically, as illustrated in FIG. 6, first, it is preferable that a width W1 on the short side of the scattering unit 21 and a width Wz on the short side of the red conversion unit 22 have substantially the same dimensions. It is needless to say that the dimension of the width W1 and the dimension of the width Wz may be different. In addition, it is preferable that an inclination angle $\theta$ of the inclined side surface 26 at the first end portion 251 is approximately defined by a width Wx and a thickness Wa of the blue reflection layer 25. In other words, it is preferable to consider the value of $\tan^{-1}(Wa/Wx)$ as the inclination angle. The width Wx is a width on the short side of a part that covers the scattering unit 21 on the back surface 257 of the blue reflection layer 25. Although this is not illustrated, this also applies to the inclination angle of the inclined side surface 26 of the second end portion 252. Further, it is preferable that a width Wy on the short side of the light shielding member 24 is 1 μm or less from the viewpoint of making the pixel size of the pixel 4 finer.

Furthermore, it is preferable that each dimension of the width Wa and a thickness Wb and the width Wz of the red conversion unit 22 is determined to satisfy the condition of $Wz/(Wa+Wb)<1$. The reflection and transmission performance of the blue reflection layer 25 has properties of depending on the incident angle of the light incident on the blue reflection layer 25, and generally, when the incident angle exceeds approximately 45 degrees, the blue reflection layer 25 does not exhibit a desired reflection and transmission performance.

In this regard, when each dimension of the width Wa, the thickness Wb, and the width Wz is determined so as to satisfy the above-described condition, the incident angle of the blue light B (not illustrated in FIG. 6) leaking from the red and green conversion units 22 and 23 becomes 45 degrees of less, and the blue reflection layer 25 exhibits desired reflection performance. Here, the reflection and transmission performance of the blue reflection layer 25 indicates the ability of the blue reflection layer 25 to reflect and transmit the light incident on the blue reflection layer 25.

Even when the condition of $Wz/(Wa+Wb)<1$ is not satisfied, that is, even when each dimension of the width Wa, the thickness Wb, and the width Wz is determined such that the incident angle exceeds 45 degrees, there is no problem as long as the blue reflection layer 25 exhibits desired reflection and transmission performance.

Figure 7:
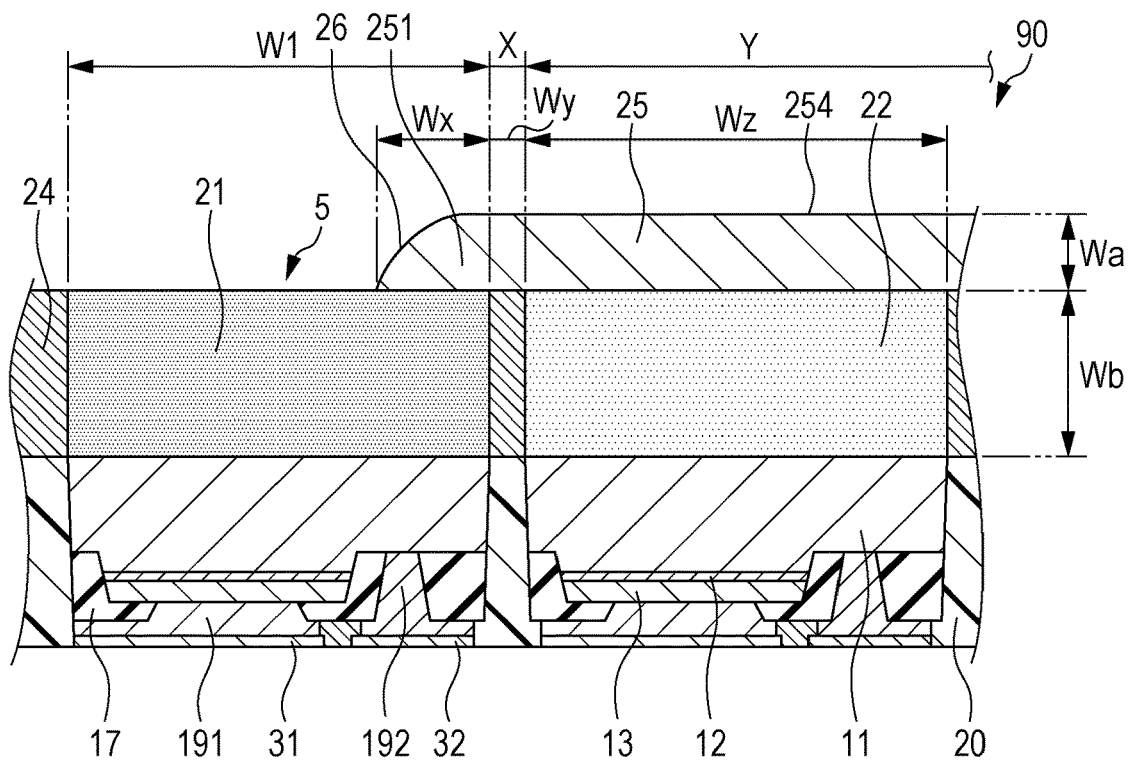
FIG. 7 is a sectional view schematically illustrating the structure of the image display device in a case where the inclined side surface of the second part has an arc shape.

Next, as illustrated in FIG. 7, in a case where the inclined side surface 26 is processed into, for example, an arc shape that protrudes outside the image display device 90, it is preferable that each dimension or the like of the blue reflection layer 25, each of the sub pixels 5 to 7, and the light shielding member 24 is determined as follows. When the above-described dimensions or the like are determined as described below, it is possible to absorb processing variations in an area X of the blue reflection layer 25. Therefore, it becomes easy to ensure the flatness of an area Y of the blue reflection layer 25 with respect to the surface of the red conversion unit 22 on the side that emits the red light R and the surface of the green conversion unit 23 on the side that emits the green light G.

Here, the area X is a part of the blue reflection layer 25, which is disposed immediately above the light shielding member 24 disposed between the scattering unit 21 and the red conversion unit 22. The area Y is a part of the blue reflection layer 25, which is disposed immediately above the red conversion unit 22 and the green conversion unit 23 (not illustrated in FIG. 7), and is a part including the flat surface 254.

Specifically, as illustrated in FIG. 7, first, it is preferable that the width W1 and the width Wz have substantially the same dimensions. However, the dimension of the width W1 and the dimension of the width Wz may be different. It is preferable that the width Wy is 1 μm or less from the viewpoint of making the pixel size of the pixel 4 finer. It is preferable that each dimension of the width Wa, the thickness Wb, and the width Wz is determined to satisfy the condition of $Wz/(Wa+Wb)<1$. However, the condition of $Wz/(Wa+Wb)<1$ may not be satisfied when the blue reflection layer 25 exhibits desired reflection and transmission performance. This is the same as that in a case where the above-described inclined side surface 26 is processed into a planar shape.

Method of Manufacturing Image Display Device

Figure 8:
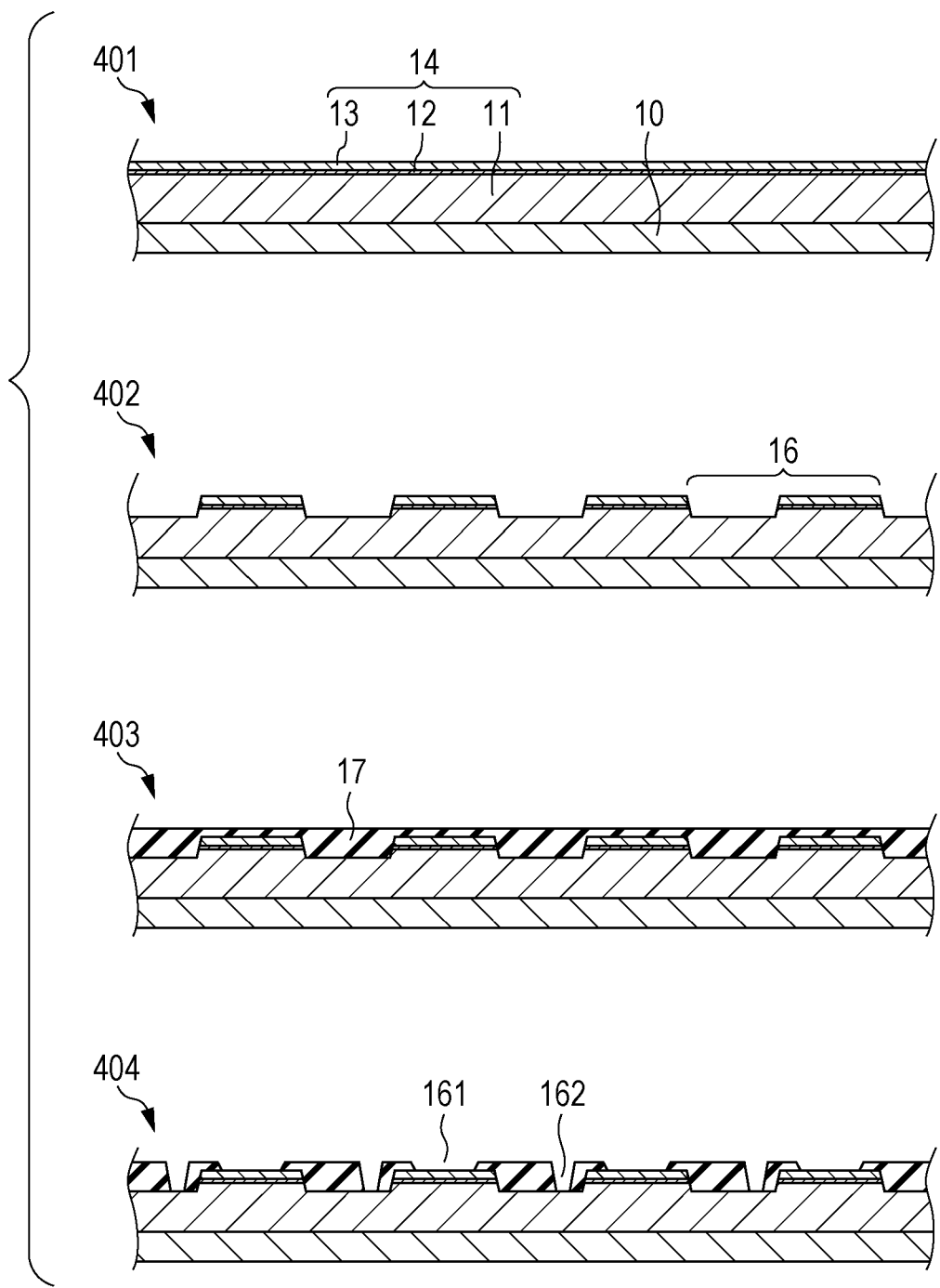
In FIG. 8, views indicated by reference numerals 401 to 404 are sectional views schematically illustrating a part of a manufacturing method of the image display device according to the embodiment of the disclosure.
Figure 9:
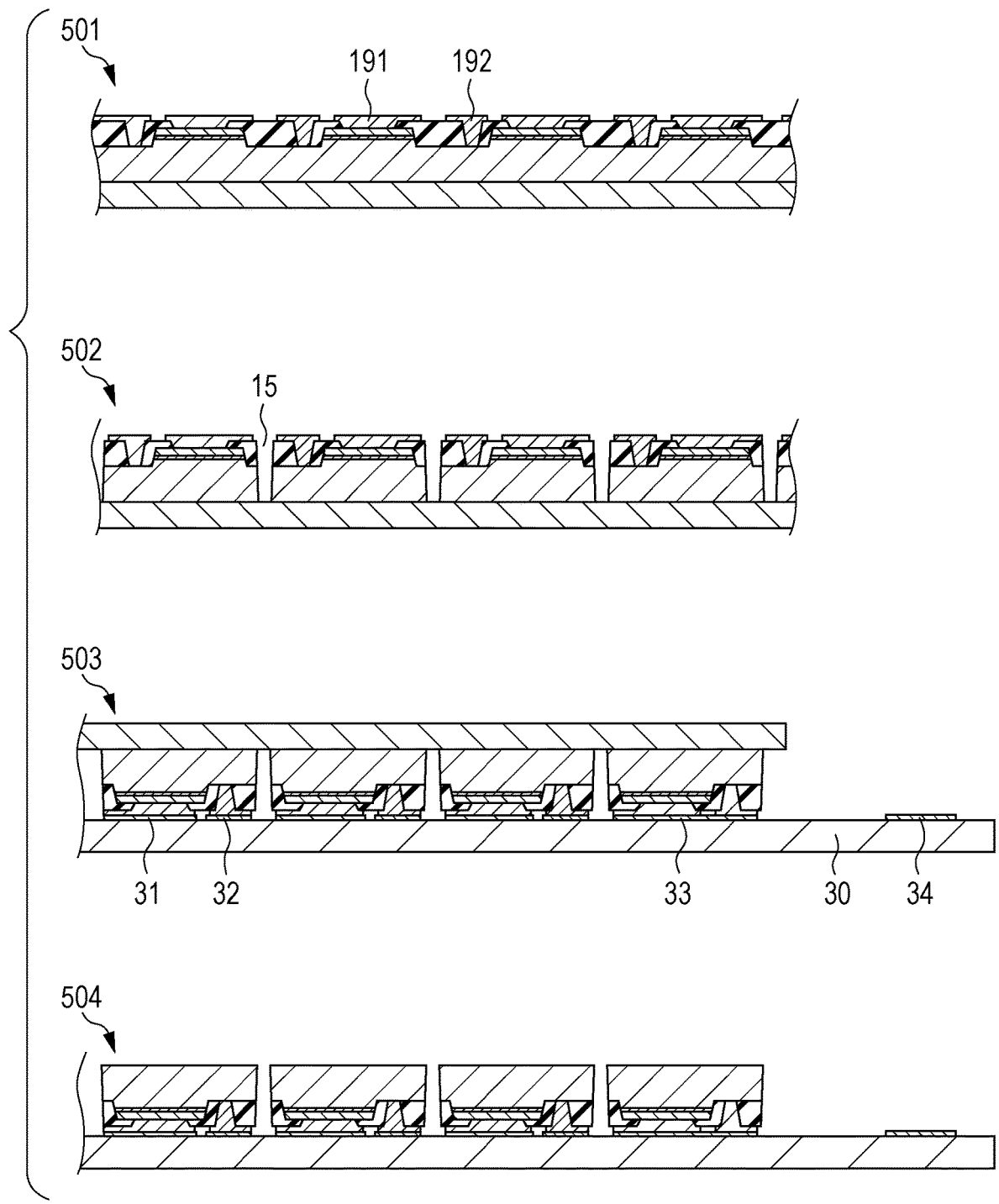
In FIG. 9, views indicated by reference numerals 501 to 504 are sectional views schematically illustrating a part of the manufacturing method of the image display device according to the embodiment of the disclosure.
Figure 10:
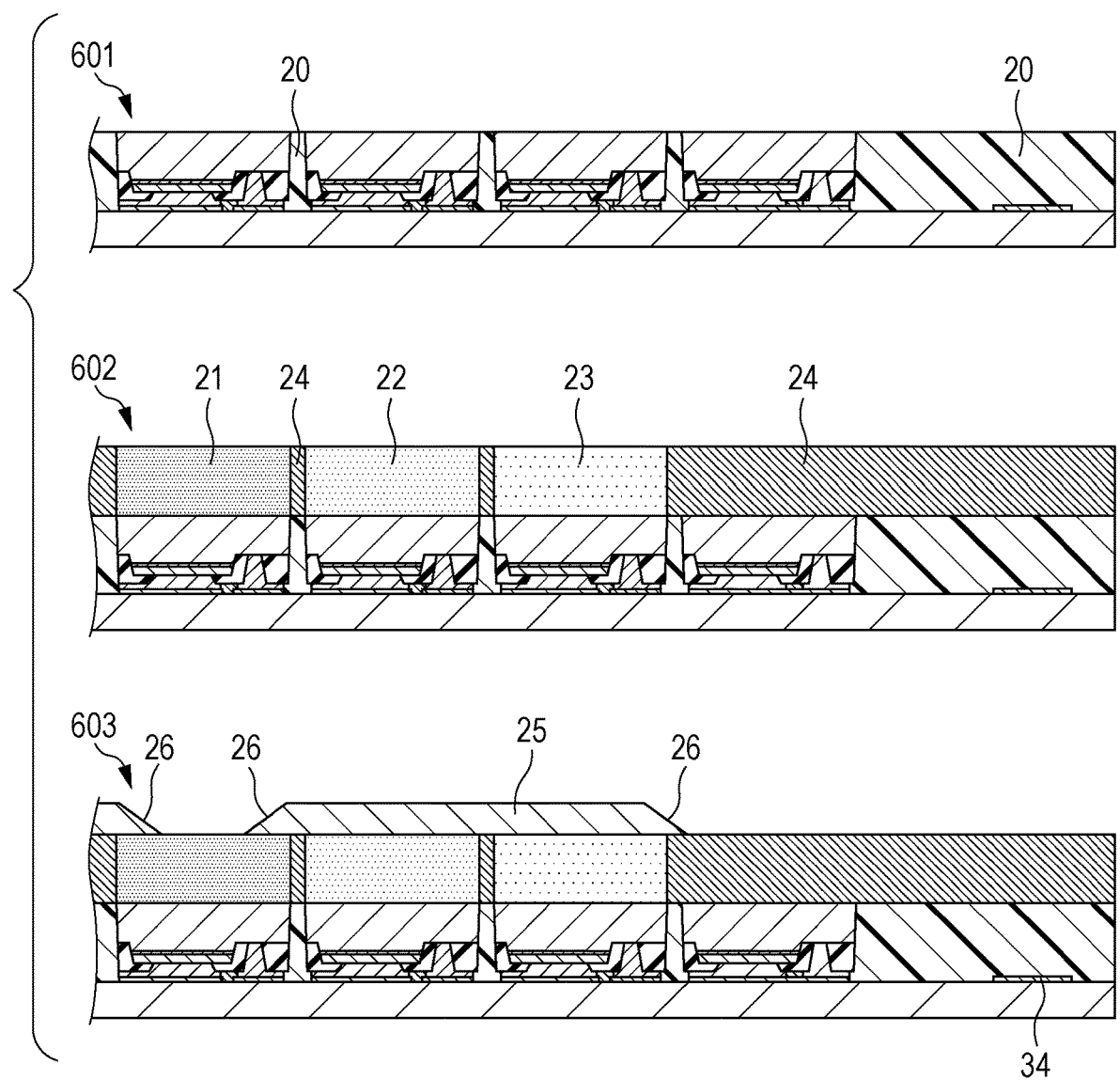
In FIG. 10, views indicated by reference numerals 601 to 603 are sectional views schematically illustrating a part of the manufacturing method of the image display device according to the embodiment of the disclosure.

The image display device 90 is manufactured by performing each step illustrated in FIGS. 8 to 10, for example. Specifically, first, as illustrated in a view indicated by a reference numeral 401 in FIG. 8, by laminating the N side layer 11, the light emitting layer 12, and the P side layer 13 in this order on a growth substrate 10, the nitride semiconductor layer 14 is formed. The growth substrate 10 is, for example, a sapphire substrate and may have protrusion portions and recess portions formed on the surface. The growth substrate 10 may be formed of silicon, silicon carbide, or the like. It is preferable that the growth substrate 10 has the same size as that of the drive circuit substrate 30.

As a substance that forms the nitride semiconductor layer 14, for example, a GaN-based semiconductor can be used. As a device for growing the nitride semiconductor layer 14 on the growth substrate 10, for example, an MOCVD device can be used. After the nitride semiconductor layer 14 is formed on the growth substrate 10, it is preferable that the warpage of the growth substrate 10 is small in a step of returning the growth substrate 10 to room temperature. For example, in a case of an 8-inch wafer, it is preferable that the warpage of the growth substrate 10 is 35 μm or less in order to facilitate the bonding of the growth substrate 10 and the drive circuit substrate 30 described later. The warpage of the growth substrate 10 can be reduced by providing an appropriate buffer layer in the N side layer 11, for example.

The thickness of the N side layer 11 is generally 10 μm or less, and is approximately 5 μm±2 μm in many cases. The thickness of the light emitting layer 12 is generally 10 nm or more and 200 nm or less, and is approximately 50 nm or more and 100 nm or less in many cases. The thickness of the P side layer 13 is generally 50 nm or more and 1000 nm or less, and is approximately 100 nm or more and 300 nm or less in many cases.

Next, as illustrated in a view indicated by a reference numeral 402 in FIG. 8, a part of the N side layer 11, the light emitting layer 12 and the P side layer 13 is etched to form a plurality of mesas 16. Next, as illustrated in a view indicated by a reference numeral 403 in FIG. 8, the protection film 17 is formed on the surface of the nitride semiconductor layer 14 on the side on which the mesa 16 is formed. Next, as illustrated in a view indicated by a reference numeral 404 in FIG. 8, a part of the protection film 17 formed on the top surface of the mesa 16 is etched to form a P side contact hole 161. Further, a part of the part of the protection film 17 formed on the bottom surface of the mesa 16 is etched to form an N side contact hole 162.

Next, as illustrated in a view indicated by a reference numeral 501 in FIG. 9, the P electrode 191 is formed in the P side contact hole 161, and the N electrode 192 is formed in the N side contact hole 162. Next, as illustrated in a view indicated by a reference numeral 502 in FIG. 9, the part including the bottom surface of the mesa 16 and formed by the protection film 17 and the nitride semiconductor layer 14 is etched to form the pixel separation groove 15. Although not illustrated, after polishing the growth substrate 10 in which the pixel separation groove 15 is formed, the growth substrate 10 is divided into individual pieces by the unit of the image display device 90.

Next, as illustrated in a view indicated by a reference numeral 503 in FIG. 9, the individual growth substrate 10 and the drive circuit substrate 30 are bonded together. Specifically, by connecting the P electrode 191 and the N electrode 192 formed on the growth substrate 10 to the P side electrode 31, the N side electrode 32, and the dummy electrode 33 arranged on the drive circuit substrate 30, the growth substrate 10 and the drive circuit substrate 30 are bonded to each other. The drive circuit substrate 30 may be in a wafer state, or may be in a chip state divided into units of the image display device 90. In the embodiment, the drive circuit substrate 30 will be described as being in a wafer state.

Next, as illustrated in a view indicated by a reference numeral 504 in FIG. 9, only the growth substrate 10 is peeled off from the drive circuit substrate 30. The growth substrate 10 can be peeled off by, for example, etching, polishing, or laser lift-off, and the peeling means is not limited. In a state where the growth substrate 10 and the drive circuit substrate 30 are bonded to each other, the P electrode 191 and the N electrode 192 are temporarily connected to the P side electrode 31, the N side electrode 32, and the dummy electrode 33, it is preferable that these are permanently connected to each other after the peeling of the growth substrate 10. This is because, in a case where the coefficient of thermal expansion of the growth substrate 10 and the coefficient of thermal expansion of the drive circuit substrate 30 are different, when the permanent connection with a large temperature rise is performed in a state where the growth substrate 10 and the drive circuit substrate 30 are bonded to each other, an unintended deformation occurs.

Next, as illustrated in a view indicated by a reference numeral 601 in FIG. 10, the pixel separation groove 15 is filled with the embedding material 20. Further, the embedding material 20 is also filled in a space that forms a part of the dummy area 2 and a part of the outer peripheral portion 3. The filling of the embedding material 20 may be performed before the growth substrate 10 is peeled off from the drive circuit substrate 30.

Next, as illustrated in a view indicated by a reference numeral 602 in FIG. 10, the scattering unit 21 is placed on the N side layer 11 that forms the micro LED element 201. The red conversion unit 22 is placed on the N side layer 11 that forms the micro LED element 202. Furthermore, the green conversion unit 23 is placed on the N side layer 11 that forms the micro LED element 203.

At the same time, the light shielding member 24 fills the space between the scattering unit 21 and the red conversion unit 22, the space between the red conversion unit 22 and the green conversion unit 23, and the space between the scattering unit 21 and the green conversion unit 23. Further, the light shielding member 24 is placed on the N side layer 11 and the embedding material 20, which form a part of the dummy area 2 and a part of the outer peripheral portion 3.

The placement of each color conversion unit in this step can be realized by a photolithography technique using, for example, a negative type resist mixed with wavelength conversion particles. The wavelength conversion particles may be phosphor particles, or quantum dots or quantum rods. It is preferable that the scattering unit 21, the red conversion unit 22, and the green conversion unit 23 have substantially the same thickness. This is because, when the thicknesses are different, the difference in the light distribution between the sub pixels becomes remarkable, and there is a problem that the tinge looks different depending on the viewing direction of the image display device 90. Further, by making the thicknesses of the scattering unit 21, the red conversion unit 22, and the green conversion unit 23 approximately the same, it is possible to ensure the flatness of the surface including the surface of each of the sub pixels 5 to 7 on the side that emits light. Therefore, the blue reflection layer 25 and the passivation film 27 described later can be easily formed.

Next, the blue reflection layer 25 is formed as illustrated in a view indicated by a reference numeral 603 in FIG. 10. Specifically, the dielectric multilayer films are deposited on the surface of each of the scattering unit 21, the red conversion unit 22, and the green conversion unit 23 on the side that emits light, and on the surface of the light shielding member 24 on the side exposed to the outside. Then, the deposited dielectric multilayer film is processed so as to remain in the end portion on the long side of the scattering unit 21, on the entire surface of the red sub pixel 6, and on the entire surface of the green sub pixel 7. When processing the dielectric multilayer film, the dielectric multilayer film is processed such that the end surface of the part that covers the end portion on the long side of the scattering unit 21 is inclined in a predetermined direction. The end surface after the processing becomes the inclined side surface 26. This processing can be performed by patterning using a normal photolithography technique, for example.

Next, although not illustrated, the light shielding member 24 and the embedding material 20 on the outer peripheral portion 3 are removed and the external connection electrodes 34 are exposed to the outside, and accordingly, the manufacturing of the image display device 90 is completed. The image display device 90 formed on the drive circuit substrate 30 is finally individually cut and mounted in a package.

Modification Example

Modification examples of the image display device 90 according to the embodiment of the disclosure will be described with reference to FIGS. 11 to 15. For convenience of description, members having the same functions as those of the members described in the above-described embodiment are given the same reference numerals, and the description thereof will not be repeated.

First Modification Example

Figure 11:
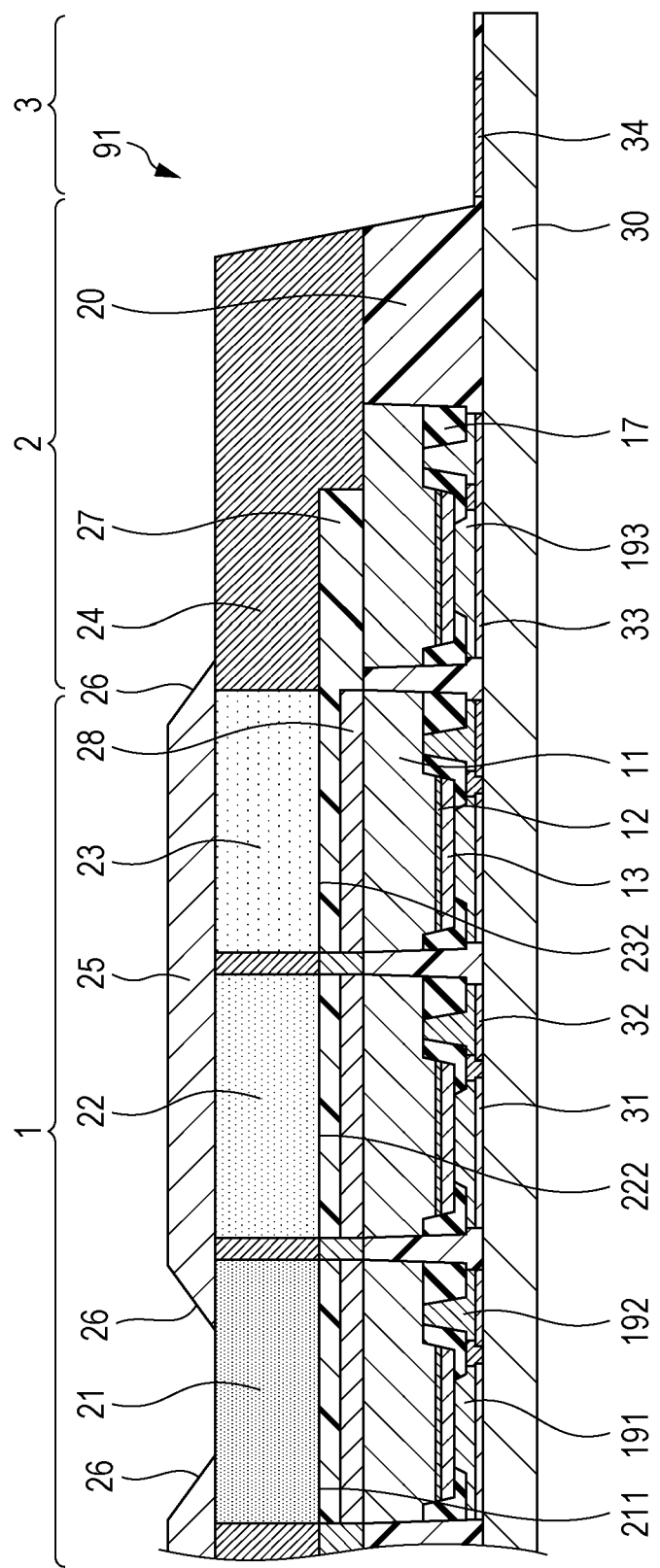
FIG. 11 is a sectional view schematically illustrating a structure of a first modification example of the image display device according to the embodiment of the disclosure.

First, as illustrated in FIG. 11, an image display device 91 in which a back surface 211 of the scattering unit 21, a back surface 222 of the red conversion unit 22, and a back surface 232 of the green conversion unit 23 are covered with red and green reflection layers 28 is assumed as a modification example of the image display device 90. The back surface 211 faces the micro LED element 201, the back surface 222 faces the micro LED element 202, and the back surface 232 faces the micro LED element 203. The red and green reflection layer 28 is an example of a second reflection layer according to the disclosure, and transmits the blue light B and reflects the red light R and the green light G. The red and green reflection layer 28 is, for example, a dielectric multilayer film.

Further, in the image display device 91, the passivation film 27 is disposed between the red and green reflection layer 28 and the back surfaces 211, 222, and 232. The passivation film 27 of the image display device 91 is a protection film for protecting the dielectric multilayer film, which has high hygroscopicity and easily deteriorates. The passivation film 27 may be formed of a CVD film such as a silicon nitride film or a resin material such as a silicone resin.

By providing the red and green reflection layer 28, the red light R emitted from the red conversion unit 22 toward the micro LED element 202 and the green light G emitted from the green conversion unit 23 toward the micro LED element 203 are reflected by the red and green reflection layer 28. Therefore, the light extraction efficiency in the red and green sub pixels 6 and 7 can be improved. It is not fundamental to provide the passivation film 27 in the image display device 91. The back surface 211 of the scattering unit 21 may not be covered with the red and green reflection layer 28.

Second Modification Example

Figure 12:
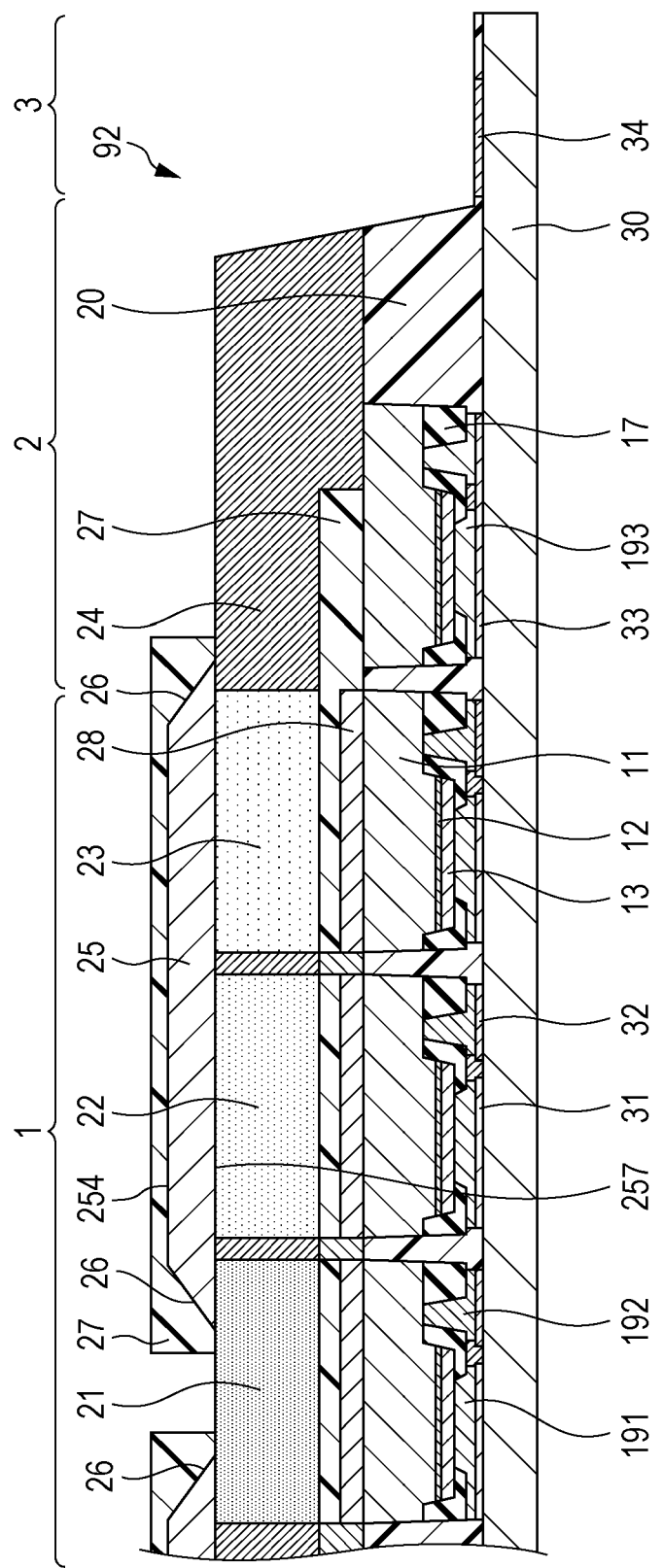
FIG. 12 is a sectional view schematically illustrating a structure of a second modification example of the image display device according to the embodiment of the disclosure.

Next, as illustrated in FIG. 12, an image display device 92 in which a surface other than the back surface 257 of the blue reflection layer 25, specifically, the flat surface 254 and the two inclined side surfaces 26 are covered with the passivation film 27 is also assumed as a modification example of the image display device 90. The flat surface 254 and the two inclined side surfaces 26 are examples of a "surface of the first layer other than the back surface facing the first wavelength conversion unit and the second wavelength conversion unit" according to the disclosure.

The passivation film 27 of the image display device 92 is also a protection film for protecting the dielectric multilayer film, and protects the blue reflection layer 25 which is the dielectric multilayer film. The passivation film 27 is an example of the passivation film according to the disclosure. By providing the above-described passivation film 27, it is possible to suppress deterioration of the blue reflection layer 25 due to water adsorption or the like, and to maintain normal functioning of the blue reflection layer 25.

The image display device 92 is provided with the passivation film 27 and the red and green reflection layer 28 at the same position as that in the image display device 91. However, either one or both of these members may not be provided in the image display device 92.

Third Modification Example

Figure 13:
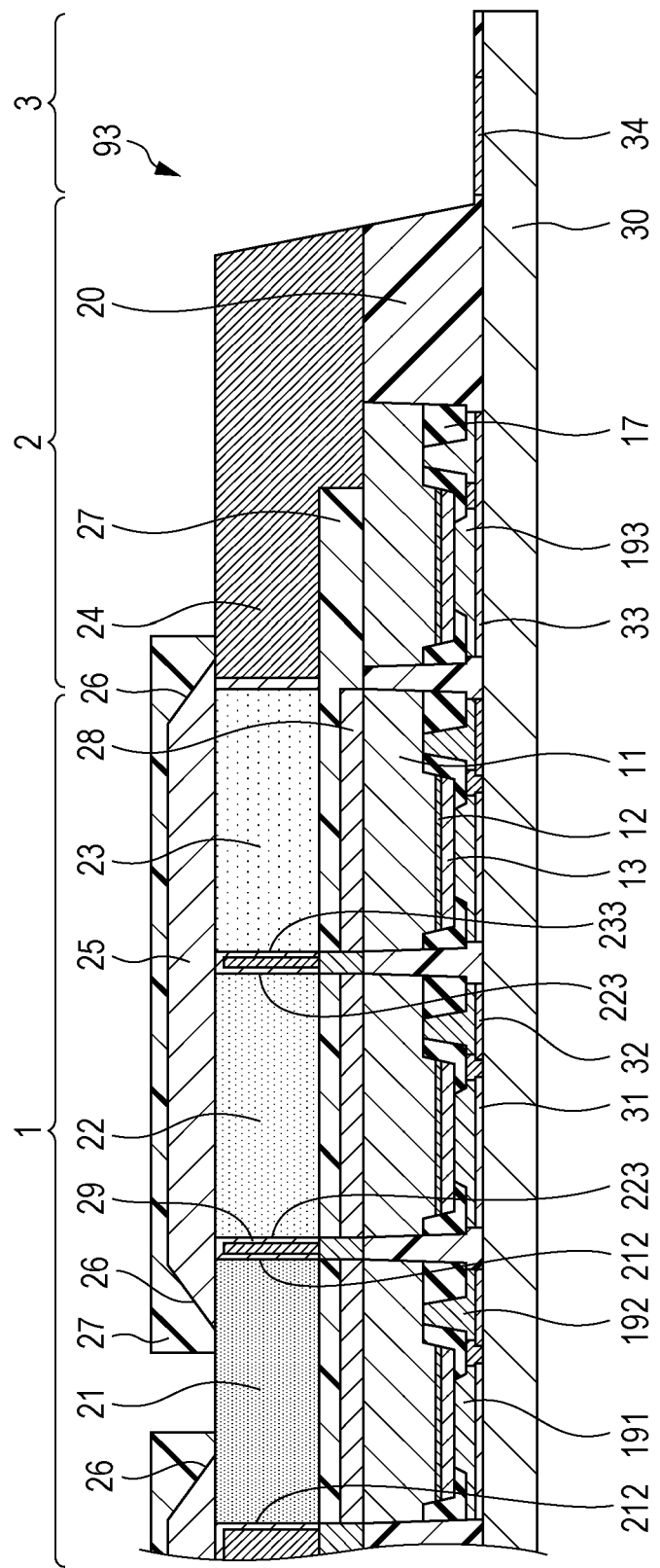
FIG. 13 is a sectional view schematically illustrating a structure of a third modification example of the image display device according to the embodiment of the disclosure.

Next, as illustrated in FIG. 13, an image display device 93 in which a side surface 223 of the red conversion unit 22 and a side surface 233 of the green conversion unit 23 are covered with a light reflection film 29 is also assumed as a modification example of the image display device 90. The light reflection film 29 is an example of a first reflection layer according to the disclosure, and reflects the blue light B, the red light R, and the green light G. The light reflection film 29 is, for example, a dielectric multilayer film or a metal film.

By providing the light reflection film 29, the red light R leaking from the side surface 223 of the red conversion unit 22 is reflected by the light reflection film 29 toward the blue reflection layer 25. Similarly, the green light G leaking from the side surface 233 of the green conversion unit 23 is also reflected by the light reflection film 29 toward the blue reflection layer 25. Therefore, the light extraction efficiency in the red and green sub pixels 6 and 7 can be improved.

At the same time, reduction of the blue light B that is obliquely emitted from each of the micro LED elements 201 to 203 (refer to FIG. 1) and enters each of the sub pixels 5 to 7 arranged next to each of the micro LED elements 201 to 203 can be also realized by providing the light reflection film 29. For example, the blue light B obliquely emitted from the micro LED element 202 is blocked by the light reflection film 29, and accordingly, it is possible to reduce the entering of the blue light B into the scattering unit 21 of the blue sub pixel 5.

In the image display device 93, a side surface 212 of the scattering unit 21 is also covered with the light reflection film 29. By covering the side surface 212 of the scattering unit 21 with the light reflection film 29, for example, the red light R leaking from the light reflection film 29 that covers the side surface 223 of the red conversion unit 22 can be reflected toward the blue reflection layer 25. Similarly, the green light G leaking from the light reflection film 29 that covers the side surface 233 of the green conversion unit 23 can also be reflected toward the blue reflection layer 25. Therefore, the light extraction efficiency in the red and green sub pixels 6 and 7 can further be improved.

Fourth Modification Example

Figure 14:
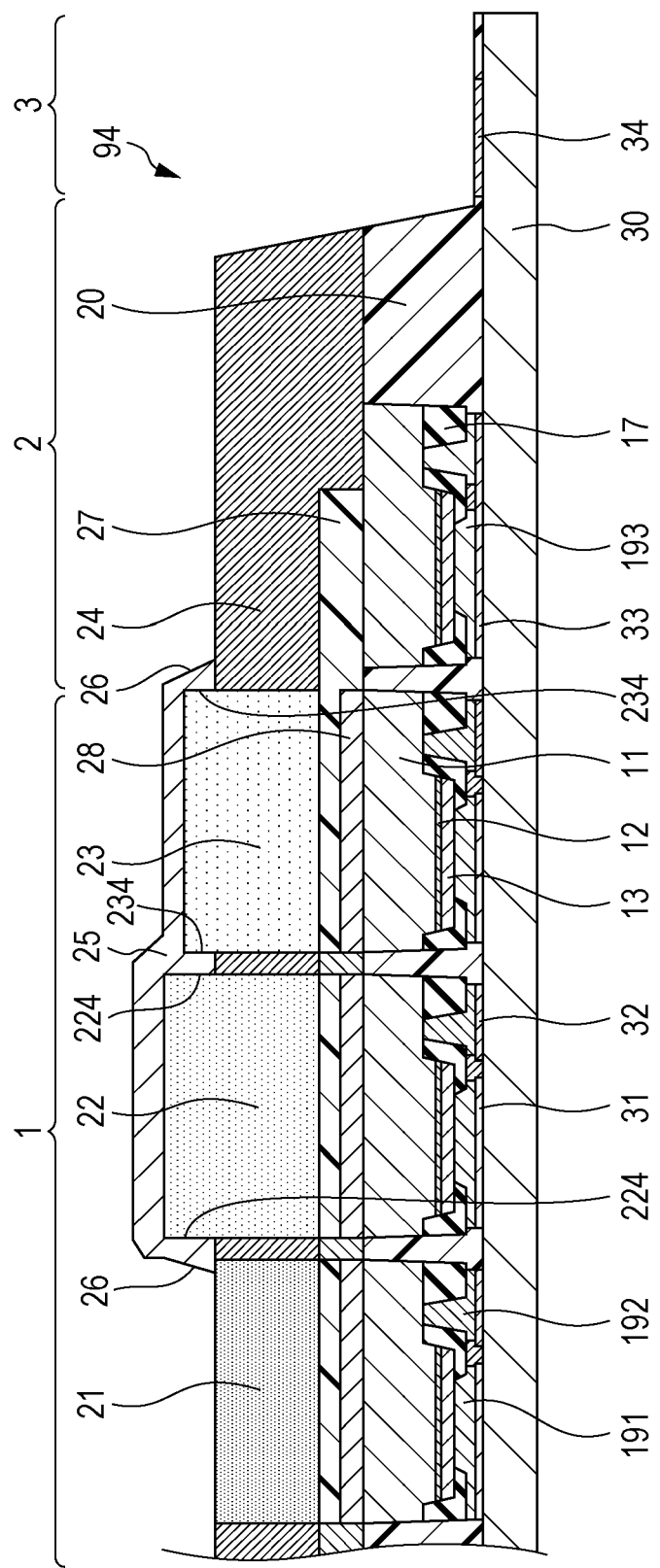
FIG. 14 is a sectional view schematically illustrating a structure of a fourth modification example of the image display device according to the embodiment of the disclosure.

Next, as illustrated in FIG. 14, an image display device 94 in which side surfaces 224 and 234 of the red and green conversion units 22 and 23 are covered with the blue reflection layer 25 is also assumed as a modification example of the image display device 90. The side surfaces 224 and 234 are the side surfaces of the red and green conversion units 22 and 23 of the part that projects in the emitting direction of the red light R and the green light G further than the scattering unit 21. In the image display device 94, the order of thickness is, the red conversion unit 22, the green conversion unit 23, and the scattering unit 21, from the largest to the smallest, and accordingly, the red conversion unit 22 and the green conversion unit 23 are projected in the emitting direction of the red light R and the green light G further than the scattering unit 21.

The order of thickness is merely an example, and for example, the order of thickness may be the green conversion unit 23, the red conversion unit 22, and the scattering unit 21, from the largest to the smallest, or the thickness of the red conversion unit 22 may be the same as the thickness of the green conversion unit 23. By changing the thicknesses of each of the scattering unit 21, the red conversion unit 22, and the green conversion unit 23, the red and green conversion units 22 and 23 are not necessarily projected in the emitting direction of the red light R and the green light G further than the scattering unit 21. Furthermore, only the red conversion unit 22 or only the green conversion unit 23 may be projected in the emitting direction of the red light R and the green light G further than the scattering unit 21.

By covering the side surfaces 224 and 234 of the red and green conversion units 22 and 23 with the blue reflection layer 25, the blue light B leaking from the side surfaces 224 and 234 of the part projecting in the emitting direction of the red light R and the green light G can be reflected by the blue reflection layer 25. Therefore, even when the thickness of the red and green conversion units 22 and 23 is thicker than the thickness of the scattering unit 21, crosstalk between the blue light B emitted from the micro LED elements 202 and 203 (refer to FIG. 1) included in the red and green sub pixels 6 and 7 and the red light R and the green light G emitted from the sub pixels adjacent to each of the red and green sub pixels 6 and 7 can be reduced.

The image display device 94 is provided with the passivation film 27 and the red and green reflection layer 28 at the same position as that in the image display device 91. However, either one or both of these members may not be provided in the image display device 94.

Fifth Modification Example

Figure 15:
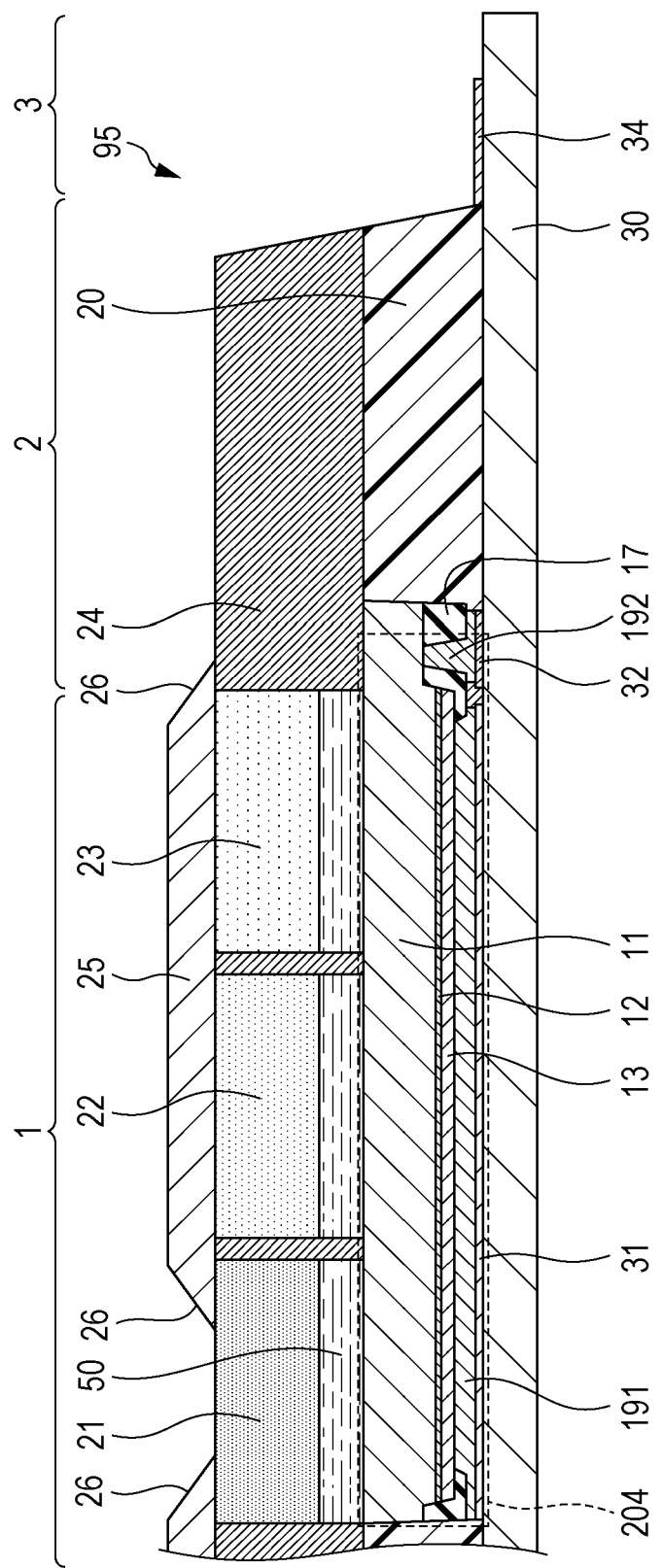
FIG. 15 is a sectional view schematically illustrating a structure of a fifth modification example of the image display device according to the embodiment of the disclosure; and In FIG. 16, a view indicated by a reference numeral 701 is a sectional view schematically illustrating a structure of the image display device according to a comparative example of the disclosure, and a view illustrated by a reference numeral 702 is a sectional view schematically illustrating a structure of the image display device according to another example of the comparative example.

Next, as illustrated in FIG. 15, an image display device 95 in which all of the micro LED elements 201 to 203 are replaced by one micro LED element 204 is also assumed as a modification example of the image display device 90. The micro LED element 204 is an example of a light source according to the disclosure, and emits the blue light B with the same configuration as that of the micro LED elements 201 to 203. In the image display device 95, one micro LED element 204 is provided for each pixel 4, but for example, one micro LED element 204 may be provided for the plurality of pixels 4.

In the image display device 95, a shutter unit 50 is disposed between the scattering unit 21, the red conversion unit 22, and the green conversion unit 23, and the micro LED element 204. The shutter unit 50 is formed of, for example, a liquid crystal material. In the image display device 95, by controlling the optical transparency of the shutter unit 50, the light amount of each light emitted from the scattering unit 21, the red conversion unit 22, and the green conversion unit 23 is adjusted, and the light output of the pixel 4 is determined.

Sixth Modification Example

Although not illustrated, a plurality of modification examples of the image display device 90 other than the image display devices 91 to 95 are assumed. For example, in the blue reflection layer 25, the inclined side surface 26 may be formed on only one of the first end portion 251 and the second end portion 252. In this case, one of the first end portion 251 and the second end portion 252 in which the inclined side surface 26 is not formed is a close side surface (not illustrated) of the blue reflection layer 25 disposed closer to the blue sub pixel 5 than the other side surface than the inclined side surface 26.

The close side surface is a surface that is substantially perpendicular to the surface of the scattering unit 21 on the side that emits the blue light B, specifically, the entire close side surface is disposed on the surface of the scattering unit 21 on the side that emits the blue light B. Only a part of the side surfaces of the blue reflection layer 25 other than the inclined side surface 26 and the close side surface is disposed on the surface of the scattering unit 21 on the side that emits the blue light B.

In this manner, even when one of the first end portion 251 and the second end portion 252 includes the close side surface, the extraction efficiency of the blue light B of the blue sub pixel 5 can be kept within the allowable range. Moreover, it is possible to reduce crosstalk between the blue light B emitted from the blue sub pixel 5 and the red light R and the green light G leaking from the red and green conversion units 22 and 23.

For example, at least one of the first end portion 251 and the second end portion 252 may not cover the end portion on the long side of the scattering unit 21. In other words, at least one of the first end portion 251 and the second end portion 252 may not face the end portion on the long side of the micro LED element 201. Furthermore, in addition, the blue reflection layer 25 may have a size facing a part of the micro LED element 201 at the maximum. In this case, the surface of the scattering unit 21 on the side that emits the blue light B has more parts exposed to the outside.

In this manner, at least one of the first end portion 251 and the second end portion 252 does not cover the end portion on the long side of the scattering unit 21, and accordingly, the extraction efficiency of the blue light B of the blue sub pixel 5 is further improved. Further, the ease of processing the blue reflection layer 25 and the reduction of crosstalk can be kept within an allowable range.

CONCLUSION

According to Aspect 1 of the disclosure, there is provided a display device (image display devices 90 to 95) having a plurality of pixels (4) formed of three or more sub pixels, in which, as the three or more sub pixels, each of the pixels includes a first sub pixel (blue sub pixel 5) including a first light source (micro LED element 201) that emits light (blue light B) having a first wavelength, a second sub pixel (red sub pixel 6) including a second light source (micro LED element 202) that emits light having the first wavelength and a first wavelength conversion unit (red conversion unit 22) that converts the light having the first wavelength emitted from the second light source into light (red light R) having a second wavelength, the second sub pixel being arranged adjacent to the first sub pixel, and a third sub pixel (green sub pixel 7) including a third light source (micro LED element 203) that emits light having the first wavelength and a second wavelength conversion unit (green conversion unit 23) that converts the light having the first wavelength emitted from the third light source into light (green light G) having a third wavelength, the third sub pixel being arranged adjacent to the second sub pixel, in which the display device further includes a first layer (blue reflection layer 25) that reflects the light having the first wavelength and transmits the light having the second wavelength and the light having the third wavelength, and in which the first layer has a size that covers a surface of the first wavelength conversion unit on a side that emits the light having the second wavelength and a surface of the second wavelength conversion unit on a side that emits the light having the third wavelength, and faces at most a part of the first light source.

According to the above configuration, in a case where the first layer has a size to the extent of not facing the first light source at all, the entire surface of the first light source on the side that emits the light having the first wavelength is exposed to the outside. Therefore, as compared with a case where the first layer has a size to the extent of facing a part of the first light source, it is possible to improve the extraction efficiency of the light having the first wavelength in the first sub pixel, and to extract the light having the first wavelength from the first sub pixel.

According to the above configuration, in a case where the first layer has a size to the extent of facing a part of the first light source, even when the light having the first wavelength obliquely leaking from the first and second wavelength conversion units is incident on the first layer at a predetermined incident angle, the light does not reach the close side surface of the first layer. Here, the "close side surface" indicates two side surfaces of the first layer arranged closer to the first sub pixel than the other side surfaces. Then, the light having the first wavelength obliquely leaking from the first and second wavelength conversion units is reflected by the first layer. Therefore, it is possible to reduce the occurrence of crosstalk between the light having the first wavelength leaking from the first and second wavelength conversion units and the light having the first wavelength emitted from the first light source.

Furthermore, even when the first layer has a size to the extent of facing a part of the first light source, the remaining part of the first light source does not face the first layer, and thus it is also possible to extract the light having the first wavelength from the first sub pixel. By the above configuration, it is possible to realize at least one of reduction of crosstalk and efficient extraction of the light having the first wavelength from the first sub pixel.

In the display device according to Aspect 2 of the disclosure, in the Aspect 1, of the two close side surfaces (inclined side surface 26) of the first layer, which are arranged closer to the first sub pixel than the other side surfaces, at least one of the close side surfaces may be inclined toward the second sub pixel arranged closest to the at least one of the close side surfaces or toward the third sub pixel arranged closest to the at least of one of the close side surfaces.

According to the above configuration, at least one of the two close side surfaces is inclined toward the second sub pixel or the third sub pixel arranged closest to the close side surface. Therefore, after leaking from the first wavelength conversion unit, the light having the first wavelength that is incident on the first layer at a specific angle is reflected inside the first layer without passing through the close side surface. Therefore, it is possible to reduce the crosstalk between the light having the first wavelength emitted from the first light source and the light having the first wavelength leaking from the first wavelength conversion unit. Further, since at least a part of the first light source does not face the first layer, it is possible to achieve both reduction of the crosstalk and extraction of the light having the first wavelength from the first sub pixel.

In the display device according to Aspect 3 of the disclosure, in the Aspect 2, at least a part of the first layer may have a structure in which two or more types of functional layers (first functional layer 40, second functional layer 41) are laminated, and the two or more types of functional layers may have different refractive indexes with respect to the light having the first wavelength.

According to the above configuration, even when a certain functional layer in the first layer transmits the light having the first wavelength, the transmitted light having the first wavelength can be reflected by another functional layer having a refractive index different from that of the certain functional layer. Therefore, as compared with a case where the first layer does not have a laminated structure of two or more types of functional layers, it is possible to reduce the leakage of the light having the first wavelength from the first layer.

In the display device according to Aspect 4 of the disclosure, in the Aspect 3, the first layer may have a first part (8) at which the two or more types of functional layers are laminated in a direction perpendicular to a surface (flat surface 254)) of the first layer opposite to a back surface (257) facing the first wavelength conversion unit and the second wavelength conversion unit, and a second part (9) at which the two or more types of functional layers (first functional layer 40, second functional layer 41), which reflect the light having the first wavelength and transmit the light having the second wavelength and the light having the third wavelength, are laminated in a direction perpendicular to an inclination direction of an inclined side surface which is the at least one of the close side surfaces inclined toward the second sub pixel or the third sub pixel.

According to the above configuration, as compared with a case where the first functional layer does not have any one of the first part and the second part, it is possible to reduce leakage of the light having the first wavelength from the first layer. Further, as compared with a case where the first layer does not have the second part, it is possible to further reduce the crosstalk between the light having the first wavelength emitted from the light source of the first sub pixel and the light having the second wavelength leaking from the first wavelength conversion unit.

In the display device according to Aspect 5 of the disclosure, in the Aspect 3, an end portion of the first layer, including the inclined side surface which is the at least one of the close side surfaces inclined toward the second sub pixel or the third sub pixel may face a part of the first light source, and have a structure in which the two or more types of functional layers that reflect the light having the first wavelength and transmit the light having the second wavelength and the light having the third wavelength are laminated, and in which, at the end portion, the number of laminated layers of the two or more types of functional layers may decrease as going toward a tip end part (256) from the part (part 255 closest to the blue reflection layer) closest to the center of the first layer.

According to the above configuration, the end portion (hereinafter, the inclined end portion) including the inclined side surface on the first layer faces a part of the first light source. Therefore, even when the pitch between the first sub pixel and the second sub pixel is shortened, the necessity of strictly adjusting the inclination angle of the inclined side surface is reduced, and high flatness of the first surface with respect to the second surface and the third surface is easily ensured. Therefore, a display device having high resolution can be realized by simple processing of the first layer. Here, the "first surface" indicates the surface of the first layer on the side that emits the light having the second wavelength and the light having the third wavelength. Further, the "second and third surfaces" indicates the surface of the first and second wavelength conversion units on the side that emits the light having the second and third wavelengths.

Further, according to the above configuration, regarding the inclined end portion, as going toward the tip end part from the part closest to the center of the first layer, the wavelength selectivity, particularly the reflectivity with respect to the light having the first wavelength deteriorates. Therefore, most of the light having the first wavelength that is perpendicularly incident on the inclined end portion transmits the inclined end portion without being reflected. Therefore, the extraction efficiency of the light having the first wavelength in the first sub pixel can be maintained to the same level as that in a case where the inclined end portion does not face the first light source at all. Here, "perpendicularly" of "perpendicularly incident on the inclined end portion" specifically means being perpendicular to the surface of the inclined end portion facing a part of the first light source.

In the display device (image display device 94) according to Aspect 6 of the disclosure, in any one of the Aspects 1 to 5, the first sub pixel has a second layer (scattering unit 21) that scatters or transmits the light having the first wavelength emitted from the first light source, at least one of the first wavelength conversion unit and the second wavelength conversion unit may be projected in an emitting direction of the light having the second wavelength further than the second layer, and, in the at least one of the first wavelength conversion unit and the second wavelength conversion unit, a side surface (224, 234) of a part projecting in the emitting direction of the light having the second wavelength further than the second layer may be covered with the first layer.

According to the above configuration, it is possible to reduce light unevenness by providing the second layer in the first sub pixel and scattering the light having the first wavelength. Further, according to the above configuration, the first layer reflects at least one of the light having the first wavelength and the light having the second wavelength leaking from the side surface of at least one of the first wavelength conversion unit and the second wavelength conversion unit, of a part projecting in the emitting direction of the light having the second wavelength further than the second layer. Therefore, for example, even when the thickness of at least one of the first wavelength conversion unit and the second wavelength conversion unit is thicker than the thickness of the second layer, it is possible to reduce crosstalk between the light having the first wavelength emitted from the first light source and the light having the first wavelength leaking from the first wavelength conversion unit.

In the display device (image display device 92) according to Aspect 7 of the disclosure, in any one of the Aspects 1 to 6, a surface of the first layer other than the back surface (257) facing the first wavelength conversion unit and the second wavelength conversion unit may be covered with a passivation film (27).

According to the above configuration, the surface of the first layer other than the surface facing the first wavelength conversion unit and the second wavelength conversion unit is protected by the passivation film. Therefore, it is possible to suppress deterioration of the first layer due to dust and water adsorption and oxidation, and to maintain the normal functioning of the first layer.

In the display device (image display device 93) according to Aspect 8 of the disclosure, in any one of the Aspects 1 to 7, the side surface (223) of the first wavelength conversion unit and the side surface (233) of the second wavelength conversion unit may be covered with a first reflection layer (light reflection film 29) that reflects the light having the second wavelength and the light having the third wavelength.

According to the above configuration, the first reflection layer reflects the light having the second wavelength leaking from the side surface of the first wavelength conversion unit toward the first layer. Similarly, the first reflection layer also reflects the light having the third wavelength leaking from the side surface of the second wavelength conversion unit toward the first layer. Therefore, the extraction efficiency of the light having the second wavelength in the second sub pixel and the extraction efficiency of the light having the third wavelength in the third sub pixel can be improved.

In the display device (image display device 91) according to Aspect 9 of the disclosure, in any one of the Aspects 1 to 8, the back surface (222) of the first wavelength conversion unit facing the second light source and the back surface (232) of the second wavelength conversion unit facing the third light source may be covered with the second reflection layer (red and green reflection layer 28) that reflects the light having the second wavelength and the light having the third wavelength.

According to the above configuration, the second reflection layer reflects the light having the second wavelength emitted from the first wavelength conversion unit toward the second light source, and the light having the third wavelength emitted from the second wavelength conversion unit toward the third light source. Therefore, the light having the second and third wavelengths emitted from the first and second wavelength conversion units toward the second and third light sources, that is, emitted in the unintended direction, can also be extracted from the second and third sub pixels. Therefore, the extraction efficiency of the light having the second wavelength in the second sub pixel and the extraction efficiency of the light having the third wavelength in the third sub pixel can be improved.

According to Aspect 10 of the disclosure, there is provided a display device (image display device 95) having a plurality of pixels (4) formed of three or more sub pixels, in which, as the three or more sub pixels, each of the pixels includes a first sub pixel (blue sub pixel 5) including a light source (micro LED element 204) that emits light (blue light B) having a first wavelength, a second sub pixel (red sub pixel 6) including the light source and a first wavelength conversion unit (red conversion unit 22) that converts the light having the first wavelength emitted from the light source into light (red light R) having a second wavelength, the second sub pixel being arranged adjacent to the first sub pixel, and a third sub pixel (green sub pixel 7) including the light source and a second wavelength conversion unit (green conversion unit 23) that converts the light having the first wavelength emitted from the light source into light (green light G) having a third wavelength, the third sub pixel being arranged adjacent to the second sub pixel, in which the display device further includes a first layer (blue reflection layer 25) that reflects the light having the first wavelength and transmits the light having the second wavelength and the light having the third wavelength, and in which the first layer has a size that covers a surface of the first wavelength conversion unit on a side that emits the light having the second wavelength and a surface of the second wavelength conversion unit on a side that emits the light having the third wavelength, and faces at most a part of the light source of the first sub pixel.

According to the above configuration, a display device using, for example, one common light source as each of the light sources of the first to third sub pixels has the same effect as that of the display device according to Aspect 1 of the disclosure.

APPENDIX

The disclosure is not limited to the above-described embodiments, and various modifications can be made within the scope of the claims, and the embodiments obtained by appropriately combining the technical means disclosed in the different embodiments can also be included in the technical scope of the disclosure. Furthermore, new technical features can be formed by combining the technical means disclosed in each embodiment.

The present disclosure contains subject matter related to that disclosed in Japanese Priority Patent Application JP 2019-227520 filed in the Japan Patent Office on Dec. 17, 2019, the entire contents of which are here by incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising a plurality of pixels formed of three or more sub pixels,
wherein, as the three or more sub pixels, each of the pixels includes
a first sub pixel including a first light source that emits light having a first wavelength,
a second sub pixel including a second light source that emits light having the first wavelength and a first wavelength conversion unit that converts the light having the first wavelength emitted from the second light source into light having a second wavelength, the second sub pixel being arranged adjacent to the first sub pixel, and
a third sub pixel including a third light source that emits light having the first wavelength and a second wavelength conversion unit that converts the light having the first wavelength emitted from the third light source into light having a third wavelength, the third sub pixel being arranged adjacent to the second sub pixel,
wherein the display device further comprises a first layer that reflects the light having the first wavelength and transmits the light having the second wavelength and the light having the third wavelength,
wherein the first layer has a size that covers a surface of the first wavelength conversion unit on a side that emits the light having the second wavelength and a surface of the second wavelength conversion unit on a side that emits the light having the third wavelength, and faces at most a part of the first light source, and
wherein, of two close side surfaces of the first layer, which are arranged closer to the first sub pixel than an other side surface, at least one of the close side surfaces is inclined toward the second sub pixel arranged closest to the at least one of the close side surfaces or toward the third sub pixel arranged closest to the at least one of the close side surfaces.

2. The display device according to claim 1,
wherein at least a part of the first layer has a structure in which two or more types of functional layers are laminated, and
wherein the two or more types of functional layers have different refractive indexes with respect to the light having the first wavelength.

3. The display device according to claim 2,
wherein the first layer has
a first part at which the two or more types of functional layers are laminated in a direction perpendicular to a surface of the first layer opposite to a back surface facing the first wavelength conversion unit and the second wavelength conversion unit, and
a second part at which the two or more types of functional layers, which reflect the light having the first wavelength and transmit the light having the second wavelength and the light having the third wavelength, are laminated in a direction perpendicular to an inclination direction of an inclined side surface which is the at least one of the close side surfaces inclined toward the second sub pixel or the third sub pixel.

4. The display device according to claim 2,
wherein, an end portion of the first layer, including an inclined side surface which is the at least one of the close side surfaces inclined toward the second sub pixel or the third sub pixel
faces a part of the first light source, and
has a structure in which the two or more types of functional layers that reflect the light having the first wavelength and transmit the light having the second wavelength and the light having the third wavelength are laminated, and
wherein, at the end portion, a number of laminated layers of the two or more types of functional layers decreases as going toward a tip end part from a part closest to a center of the first layer.

5. A display device comprising a plurality of pixels formed of three or more sub pixels,
wherein, as the three or more sub pixels, each of the pixels includes
a first sub pixel including a first light source that emits light having a first wavelength,
a second sub pixel including a second light source that emits light having the first wavelength and a first wavelength conversion unit that converts the light having the first wavelength emitted from the second light source into light having a second wavelength, the second sub pixel being arranged adjacent to the first sub pixel, and
a third sub pixel including a third light source that emits light having the first wavelength and a second wavelength conversion unit that converts the light having the first wavelength emitted from the third light source into light having a third wavelength, the third sub pixel being arranged adjacent to the second sub pixel,
wherein the display device further comprises a first layer that reflects the light having the first wavelength and transmits the light having the second wavelength and the light having the third wavelength,
wherein the first layer has a size that covers a surface of the first wavelength conversion unit on a side that emits the light having the second wavelength and a surface of the second wavelength conversion unit on a side that emits the light having the third wavelength, and faces at most a part of the first light source,
wherein the first sub pixel has a second layer that scatters or transmits the light having the first wavelength emitted from the first light source, wherein at least one of the first wavelength conversion unit and the second wavelength conversion unit is projected in an emitting direction of the light having the second wavelength further than the second layer, and wherein, in the at least one of the first wavelength conversion unit and the second wavelength conversion unit, a side surface of a part projecting in the emitting direction of the light having the second wavelength further than the second layer is covered with the first layer.

6. The display device according to claim 1,
wherein a surface of the first layer other than a back surface facing the first wavelength conversion unit and the second wavelength conversion unit is covered with a passivation film.

7. The display device according to claim 1,
wherein a side surface of the first wavelength conversion unit and a side surface of the second wavelength conversion unit are covered with a first reflection layer that reflects the light having the second wavelength and the light having the third wavelength.

8. The display device according to claim 1,
wherein a back surface of the first wavelength conversion unit facing the second light source and a back surface of the second wavelength conversion unit facing the third light source are covered with a second reflection layer that reflects the light having the second wavelength and the light having the third wavelength.

9. A display device comprising a plurality of pixels formed of three or more sub pixels,
wherein, as the three or more sub pixels, each of the pixels includes a first sub pixel including a light source that emits light having a first wavelength, a second sub pixel including the light source and a first wavelength conversion unit that converts the light having the first wavelength emitted from the light source into light having a second wavelength, the second sub pixel being arranged adjacent to the first sub pixel, and a third sub pixel including the light source and a second wavelength conversion unit that converts the light having the first wavelength emitted from the light source into light having a third wavelength, the third sub pixel being arranged adjacent to the second sub pixel, wherein the display device further comprises a first layer that reflects the light having the first wavelength and transmits the light having the second wavelength and the light having the third wavelength, wherein the first layer has a size that covers a surface of the first wavelength conversion unit on a side that emits the light having the second wavelength and a surface of the second wavelength conversion unit on a side that emits the light having the third wavelength, and faces at most a part of the light source of the first sub pixel, and wherein, of two close side surfaces of the first layer, which are arranged closer to the first sub pixel than an other side surface, at least one of the close side surfaces is inclined toward the second sub pixel arranged closest to the at least one of the close side surfaces or toward the third sub pixel arranged closest to the at least one of the close side surfaces.

* * * * *